(12) United States Patent
Tange et al.

(10) Patent No.: US 12,505,951 B2
(45) Date of Patent: *Dec. 23, 2025

(54) BLOCK COIL

(71) Applicant: Murata Manufacturing Co., Ltd., Nagaokakyo (JP)

(72) Inventors: Takayuki Tange, Milton Keynes (GB); Lee Francis, Milton Keynes (GB); Scott Andrew Parish, Milton Keynes (GB); Rohit Sidapara, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 250 days.

This patent is subject to a terminal disclaimer.

(21) Appl. No.: 18/232,682

(22) Filed: Aug. 10, 2023

(65) Prior Publication Data

US 2024/0055178 A1 Feb. 15, 2024

Related U.S. Application Data

(60) Provisional application No. 63/396,783, filed on Aug. 10, 2022.

(51) Int. Cl.
*H01F 27/28* (2006.01)
*H01F 27/02* (2006.01)
(Continued)

(52) U.S. Cl.
CPC ......... *H01F 27/306* (2013.01); *H01F 27/022* (2013.01); *H01F 27/2895* (2013.01);
(Continued)

(58) Field of Classification Search
None
See application file for complete search history.

(56) References Cited

U.S. PATENT DOCUMENTS

| 4,975,671 A | 12/1990 | Dirks |
| 2017/0018349 A1 | 1/2017 | Otsubo et al. |

(Continued)

FOREIGN PATENT DOCUMENTS

CN 113921245 A 1/2022

OTHER PUBLICATIONS

Tange et al., "Block Coil", U.S. Appl. No. 18/232,681, filed Aug. 10, 2023.

(Continued)

*Primary Examiner* — Xanthia C Relford
(74) *Attorney, Agent, or Firm* — Keating & Bennett, LLP

(57) ABSTRACT

An electronic module includes a substrate or a lead frame including primary conductive patterns and secondary conductive patterns; a magnetic core; a block coil including a resin body that is located on or above the substrate or the lead frame and that extends over the magnetic core, first terminals that define a first terminal group and that are on or embedded in the resin body, and second terminals that define a second terminal group and that on or are embedded in the resin body; an IC; and a capacitor. Two first terminals of the first terminal group are connected to corresponding primary conductive patterns; two second terminals of the second terminal group are connected corresponding secondary conductive patterns; and a first primary conductive pattern is closer to a second primary conductive pattern than any of the secondary conductive patterns.

20 Claims, 23 Drawing Sheets

(51) Int. Cl.
  *H01F 27/29* (2006.01)
  *H01F 27/30* (2006.01)
  *H01F 27/32* (2006.01)
  *H05K 1/18* (2006.01)
  *H05K 1/16* (2006.01)
  *H10D 1/20* (2025.01)

(52) U.S. Cl.
  CPC ......... *H01F 27/292* (2013.01); *H01F 27/324* (2013.01); *H05K 1/181* (2013.01); *H01F 27/2804* (2013.01); *H01F 2027/2809* (2013.01); *H05K 1/165* (2013.01); *H05K 2201/10015* (2013.01); *H05K 2201/1003* (2013.01); *H10D 1/20* (2025.01)

(56) References Cited

U.S. PATENT DOCUMENTS

| | | | |
|---|---|---|---|
| 2018/0122557 A1* | 5/2018 | Kim | H01F 27/2804 |
| 2019/0122814 A1* | 4/2019 | Hung | H01F 27/24 |
| 2020/0105458 A1 | 4/2020 | Massolini et al. | |
| 2020/0126712 A1* | 4/2020 | Kim | H01F 17/04 |
| 2021/0193369 A1* | 6/2021 | Saito | H01F 27/32 |
| 2021/0327637 A1* | 10/2021 | Eda | H01F 17/0013 |
| 2022/0013270 A1* | 1/2022 | Yoon | H01F 27/324 |
| 2022/0028593 A1* | 1/2022 | Tang | H01L 23/49503 |
| 2022/0165479 A1* | 5/2022 | Park | H01F 27/324 |
| 2024/0412917 A1* | 12/2024 | Yokoyama | H01F 27/28 |

OTHER PUBLICATIONS

Tange et al., "Block Coil", U.S. Appl. No. 19/099,539, filed Jan. 29, 2025.

\* cited by examiner

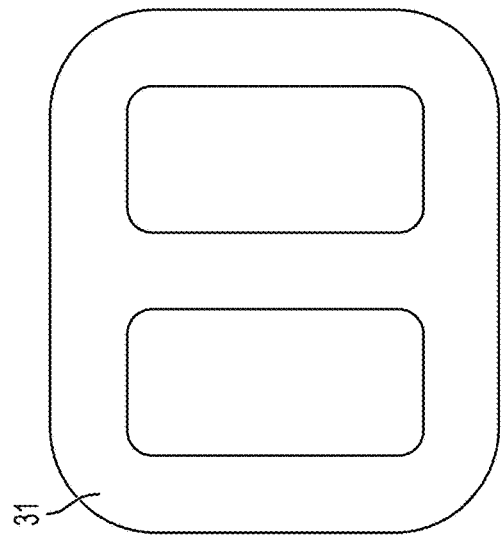
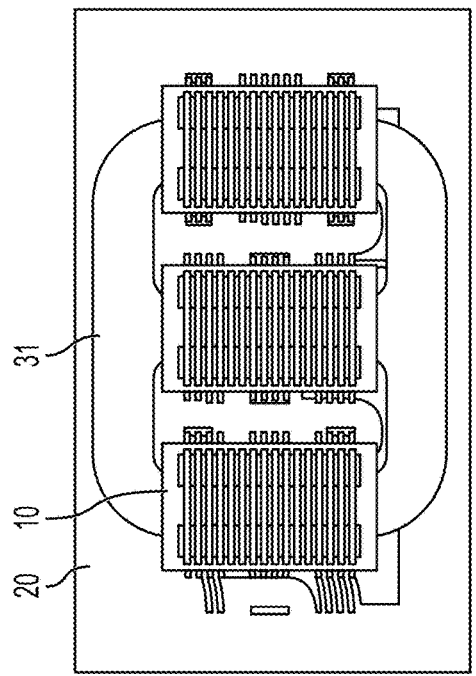
FIG. 24 E-E OR E-I MAGNETIC CORE
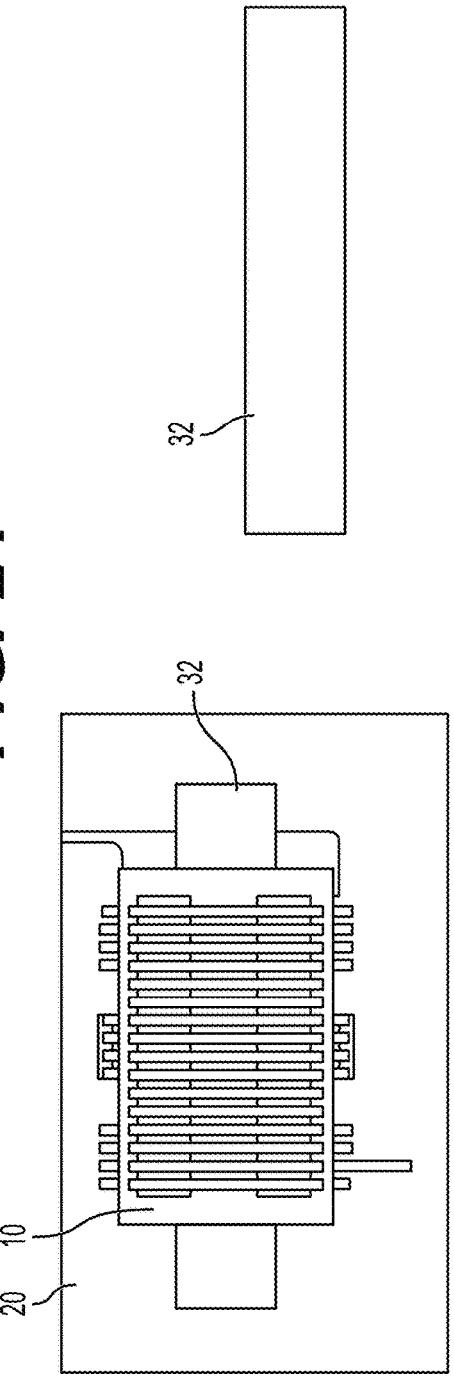
FIG. 25 STRAIGHT OR ROD-SHAPED MAGNETIC CORE

BLOCK COIL

CROSS REFERENCE TO RELATED APPLICATIONS

This application claims the benefit of U.S. Patent Application No. 63/396,783 filed on Aug. 10, 2022. The entire contents of this application are hereby incorporated by reference.

BACKGROUND OF THE INVENTION

1. Field of the Invention

The present invention relates to block coils. More specifically, the present invention relates to block coils that can be attached to a substrate or a lead frame and that can be used in a magnetic component or an electronic module.

2. Description of the Related Art

It is known to use windings that include terminals that extend over a magnetic core. Because no structure supports the terminals, there is a risk that the terminals will short circuit or fall sideways.

SUMMARY OF THE INVENTION

To overcome the problems described above, preferred embodiments of the present invention provide block coils that include a resin body and terminals on or in the resin body such that the risks of the block coil causing a short circuit and the terminals falling are eliminated or greatly reduced.

According to a preferred embodiment of the present invention, an electronic module includes a substrate or a lead frame including a primary conductive pattern and a secondary conductive pattern; a magnetic core located on or above the substrate or the lead frame; a block coil including a resin body that is located on or above the substrate or the lead frame and that extends over the magnetic core, a first terminal that is on or embedded in the resin body and that is connected to the primary conductive pattern, and a second terminal that is on or embedded in the resin body and that is connected to the secondary conductive pattern; and an electronic component located on the substrate or the lead frame.

The block coil can include additional first terminals and additional second terminals; the first terminal and the additional first terminals can define a first terminal group; and the second terminal and the additional second terminals can define a second terminal group. Each terminal in the first terminal group can be connected to a corresponding primary conductive pattern; and each terminal in the second terminal group can be connected to a corresponding secondary conductive pattern. The first terminal group can be located next to and spaced away from the second terminal group.

The substrate or the lead frame can include first and second layers. The primary conductive pattern can be in the first layer; the secondary conductive pattern can be in the second layer; and from a side view of the substrate, a portion of the primary conductive pattern and a portion of the secondary conductive pattern can overlap vertically. The electronic module can further include an additional primary conductive pattern in a third layer of the substrate and an additional secondary conductive pattern in a fourth layer of the substrate, wherein from the side view of the substrate, a portion of the additional primary conductive pattern and a portion of the additional secondary conductive pattern can overlap vertically.

The electronic module can further include an insulating material covering the substrate or the lead frame, the magnetic core, and the block coil. The electronic component can include an integrated circuit (IC) and/or a capacitor.

According to a preferred embodiment of the present invention, an electronic module includes a substrate or a lead frame including a conductive pattern; a magnetic core located on or above the substrate or the lead frame; first and second block coils, each of the first and the second block coils including a resin body that is located on or above the substrate or the lead frame and that extends over the magnetic core and including a first terminal that is on or embedded in the resin body and that is connected to the conductive pattern; an electronic component located on the substrate or the lead frame; and an insulating material covering the substrate or the lead frame, the magnetic core, and the block coil.

The conductive pattern can be a primary conductive pattern, and the first terminal of the first block coil can be connected only to the primary conductive pattern. The conductive pattern can be a secondary conductive pattern, and the first terminal of the second block coil can be connected only to the secondary conductive pattern. The electronic module can further include a third block coil including first and second terminals, wherein the first terminal can be connected to a primary conductive pattern and wherein the second terminal can be connected to a secondary conductive pattern.

The first block coil can include a first terminal group and a second terminal group, and the first terminal can be included in the first terminal group. Each terminal in the first terminal group can be connected to a corresponding primary conductive pattern, and each terminal in the second terminal group can be connected to a corresponding secondary conductive pattern. Each terminal in the first terminal group and each terminal in the second terminal group can be connected to a corresponding primary conductive pattern. Each terminal in the first terminal group and each terminal in the second terminal group can be connected to a corresponding secondary conductive pattern. The first group can be located next to and spaced away from the second group.

The substrate or the lead frame can include first and second layers. The electronic module can further include a primary conductive pattern in the first layer and a secondary conductive pattern in the second layer, wherein from a side view of the substrate, a portion of the primary conductive pattern and a portion of the secondary conductive pattern can overlap vertically. The electronic module can further include an additional primary conductive pattern in a third layer of the substrate and an additional secondary conductive pattern in a fourth layer of the substrate, wherein from the side view of the substrate, a portion of the additional primary conductive pattern and a portion of the additional secondary conductive pattern can overlap vertically.

The electronic component can include an integrated circuit (IC) and/or a capacitor.

According to a preferred embodiment of the present invention, a magnetic component includes a substrate or a lead frame including a primary conductive pattern and a secondary conductive pattern; a magnetic core located on or above of the substrate or the lead frame; a block coil including a resin body that is located on or above the substrate or the lead frame and that extends over the magnetic core, a first terminal that is on or embedded in the resin body and that is connected to the primary conductive pattern, and a second terminal on or embedded in the resin body and that is connected to the secondary conductive pattern; and an insulating material covering the substrate or the lead frame, the magnetic core, and the block coil.

The magnetic core can be located on the substrate or the lead frame. The magnetic core can be located above of the substrate or the lead frame and can be attached to an inner, upper surface of the block coil. The magnetic component can further include a coating covering the magnetic core.

The block coil can include additional first terminals and additional second terminals; the first terminal and the additional first terminals can define a first terminal group; and the second terminal and the additional second terminals can define a second terminal group. Each terminal in the first terminal group can be connected to a corresponding primary conductive pattern, and each terminal in the second terminal group can be connected to a corresponding secondary conductive pattern. The first terminal group can be located next to and spaced away from the second terminal group.

The substrate or the lead frame can include first and second layers; the primary conductive pattern can be in the first layer; the secondary conductive pattern can be in the second layer; and from a side view of the substrate or lead frame, a portion of the primary conductive pattern and a portion of the secondary conductive pattern can overlap vertically. The magnetic component can further include an additional primary conductive pattern in a third layer of the substrate or the lead frame and an additional secondary conductive pattern in a fourth layer of the substrate or the lead frame, wherein from the side view of the substrate or the lead frame, a portion of the additional primary conductive pattern and a portion of the additional secondary conductive pattern can overlap vertically.

According to a preferred embodiment of the present invention, a magnetic component including a substrate or a lead frame including a first layer, and a conductive pattern; a magnetic core located on or above the substrate or the lead frame; first and second block coils, each of the first and the second block coils including a resin body that is located on or above the substrate or the lead frame and that extends over the magnetic core and a first terminal that is on or embedded in the resin body and that is connected to the conductive pattern; and an insulating material covering the substrate or the lead frame, the magnetic core, and the block coil.

The magnetic core can be located on the substrate or the lead frame. The magnetic core can be located above the substrate or the lead frame and can be attached to an inner, upper surface of the first block coil and/or the second block coil. The magnetic component can further include a coating covering the magnetic core.

The magnetic component can further include a primary conductive pattern and a secondary conductive pattern, wherein the first terminal of the first block coil can be connected only to the primary conductive pattern and wherein the first terminal of the second block coil can be connected only to the secondary conductive pattern. The magnetic component can further include a third block coil including first and second terminals, wherein the first terminal can be connected to a primary conductive pattern and wherein the second terminal can be connected to a secondary conductive pattern. The first block coil can include a first terminal group and a second terminal group; the first terminal can be included in the first terminal group; each terminal in the first terminal group can be connected to a corresponding primary conductive pattern; and each terminal in the second terminal group can be connected to a corresponding secondary conductive pattern. The first group can be located next to and spaced away from the second group. The magnetic component can further include a primary conductive pattern in the first layer and a secondary conductive pattern in a second layer of the substrate or the lead frame, wherein from a side view of the substrate or the lead frame, a portion of the primary conductive pattern and a portion of the secondary conductive pattern can overlap vertically. The magnetic component can further include an additional primary conductive pattern in a third layer of the substrate or the lead frame and an additional secondary conductive pattern in a fourth layer of the substrate or the lead frame, wherein from the side view of the substrate, a portion of the additional primary conductive pattern and a portion of the additional secondary conductive pattern can overlap vertically.

According to a preferred embodiment of the present invention, an electronic module includes a substrate or a lead frame including primary conductive patterns and secondary conductive patterns; a magnetic core located on or above of the substrate or the lead frame; a block coil including a resin body that is located on or above the substrate or the lead frame and that extends over the magnetic core, first terminals that define a first terminal group and that are on or embedded in the resin body, and second terminals that define a second terminal group and that on or are embedded in the resin body; an IC located on the substrate or the lead frame; and a capacitor located on the substrate or the lead frame. Two first terminals of the first terminal group are connected to corresponding primary conductive patterns; two second terminals of the second terminal group are connected corresponding secondary conductive patterns; and a first primary conductive pattern is closer to a second primary conductive pattern than any of the secondary conductive patterns.

Each first terminal in the first terminal group can be connected to a corresponding primary conductive pattern, and each second terminal in the second terminal group can be connected to a corresponding secondary conductive pattern. The first terminal group can be located next to and spaced away from the second terminal group.

The substrate or the lead frame can include first and second layers. The primary conductive patterns can be in the first layer; the secondary conductive patterns can be in the second layer; and from a side view of the substrate, portions of the primary conductive patterns can overlap vertically corresponding portions of the secondary conductive patterns. The electronic module can further include additional primary conductive patterns in a third layer of the substrate and additional secondary conductive patterns in a fourth layer of the substrate, wherein from the side view of the substrate, portions of the additional primary conductive patterns can overlap vertically corresponding portions of the additional secondary conductive pattern.

The electronic module can further include an insulating material covering the substrate or the lead frame, the magnetic core, and the block coil. The electronic module can include the substrate, and the substrate can include a via hole. The magnetic core can be located on or above a first surface of the substrate or the lead frame, and the capacitor can be located on a second surface of the substrate or the lead frame opposite to the first surface. The electronic module can further include a coating covering the magnetic core.

According to a preferred embodiment of the present invention, an electronic module includes a substrate or a lead frame including primary conductive patterns and secondary conductive patterns; a magnetic core located on or above of the substrate or the lead frame; first and second block coils, each of the first and the second block coils includes a resin body that is located on or above the substrate or the lead frame and that extends over the magnetic core, first terminals that define a first terminal group and that are on or embedded in the resin body, and second terminals that define a second terminal group and that are on or embedded in the resin body; an IC located on the substrate or the lead frame; and a capacitor located on the substrate or the lead frame. Two first terminals of the first terminal group are connected to corresponding primary conductive patterns; two second terminals of the second terminal group are connected corresponding secondary conductive patterns; and a first primary conductive pattern is closer to a second primary conductive pattern than any of the secondary conductive patterns.

Each first terminal in the first terminal group can be connected to a corresponding primary conductive pattern, and each second terminal in the second terminal group can be connected to a corresponding secondary conductive pattern. The first terminal group can be located next to and can be spaced away from the second terminal group.

The substrate or the lead frame can include first and second layers. The primary conductive patterns can be in the first layer; the secondary conductive patterns can be in the second layer; and from a side view of the substrate, portions of the primary conductive patterns can overlap vertically corresponding portions of the secondary conductive patterns. The electronic module can further include additional primary conductive patterns in a third layer of the substrate and additional secondary conductive patterns in a fourth layer of the substrate, wherein from the side view of the substrate, portions of the additional primary conductive patterns can overlap vertically corresponding portions of the additional secondary conductive pattern.

The electronic module can further include an insulating material covering the substrate or the lead frame, the magnetic core, and the block coil. The electronic module can include the substrate, and the substrate can include a via hole. The magnetic core can be located on or above a first surface of the substrate or the lead frame, and the capacitor can be located on a second surface of the substrate or the lead frame opposite to the first surface. The electronic module can further include a coating covering the magnetic core.

The above and other features, elements, characteristics, steps, and advantages of the present invention will become more apparent from the following detailed description of preferred embodiments of the present invention with reference to the attached drawings.

BRIEF DESCRIPTION OF THE DRAWINGS

FIG. 24 shows an E-E or E-I magnetic core that can be used with three block coils.

FIG. 25 shows a rod-shaped magnetic core that can be used with a single block coil.

DETAILED DESCRIPTION OF PREFERRED EMBODIMENTS

Figure 1:
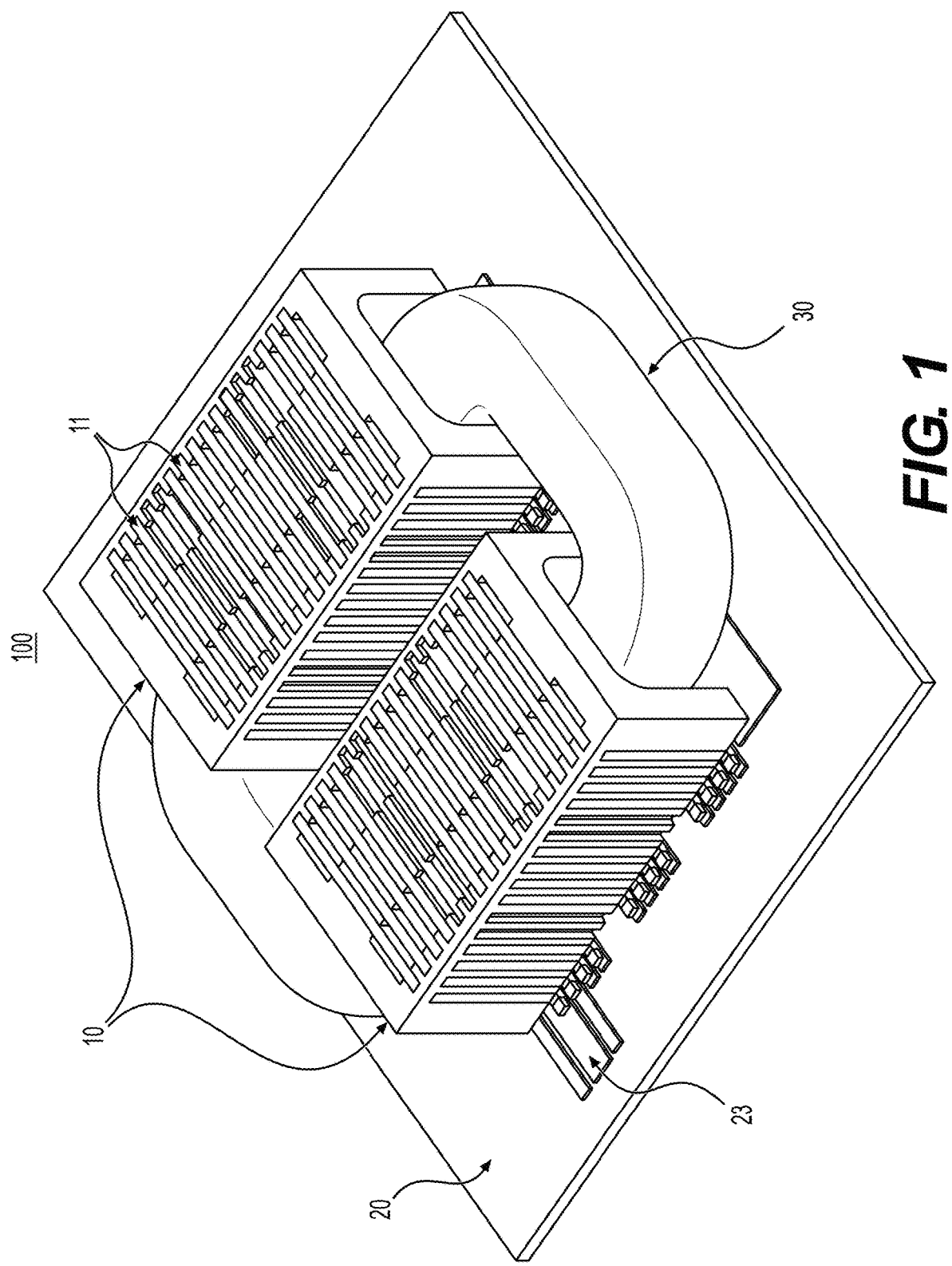
FIG. 1 is a top perspective view of block coils mounted to a substrate of a magnetic component.
Figure 2:
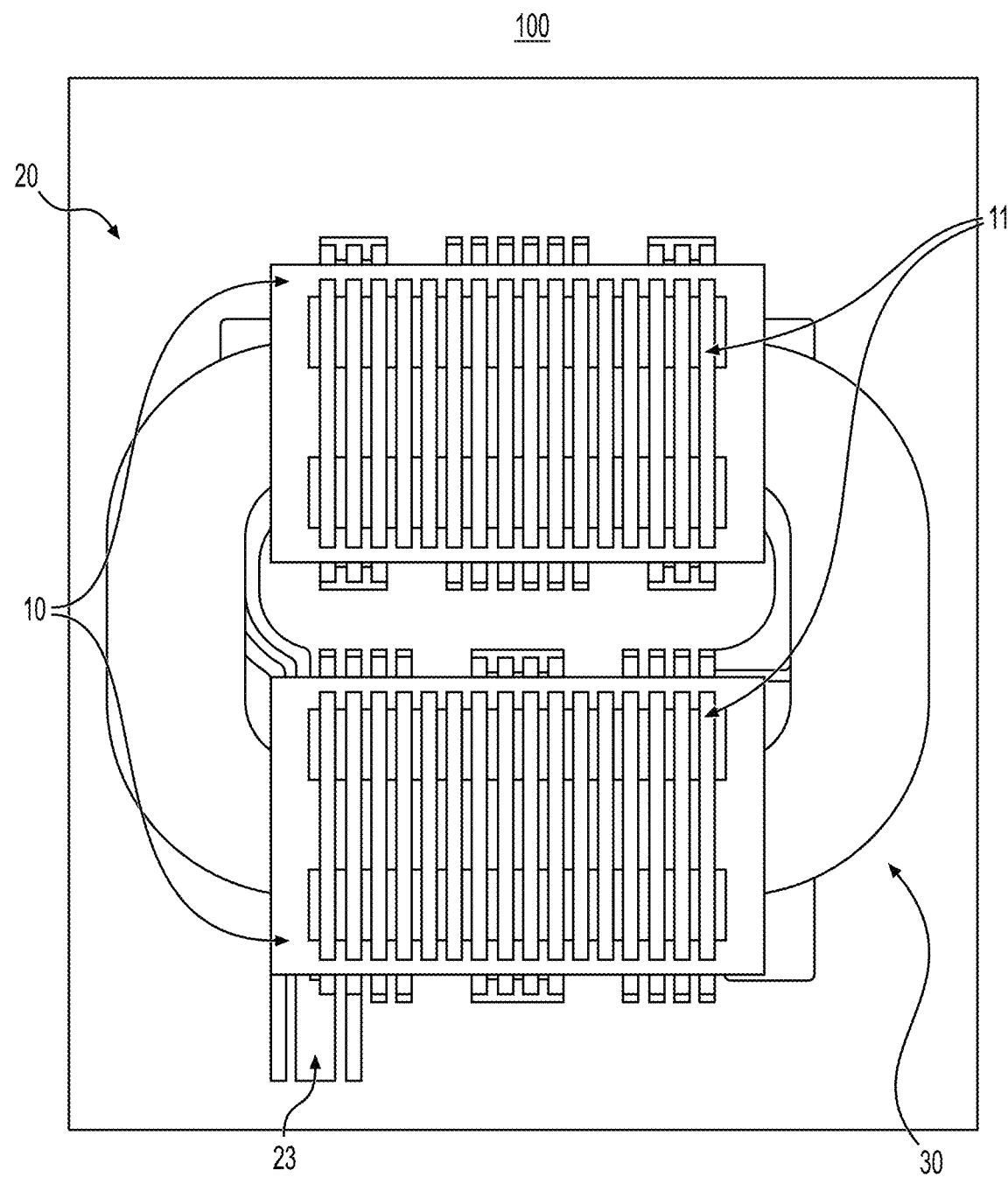
FIG. 2 is a top view of the block coils mounted to a PCB of the magnetic component of FIG. 1.
Figure 3:
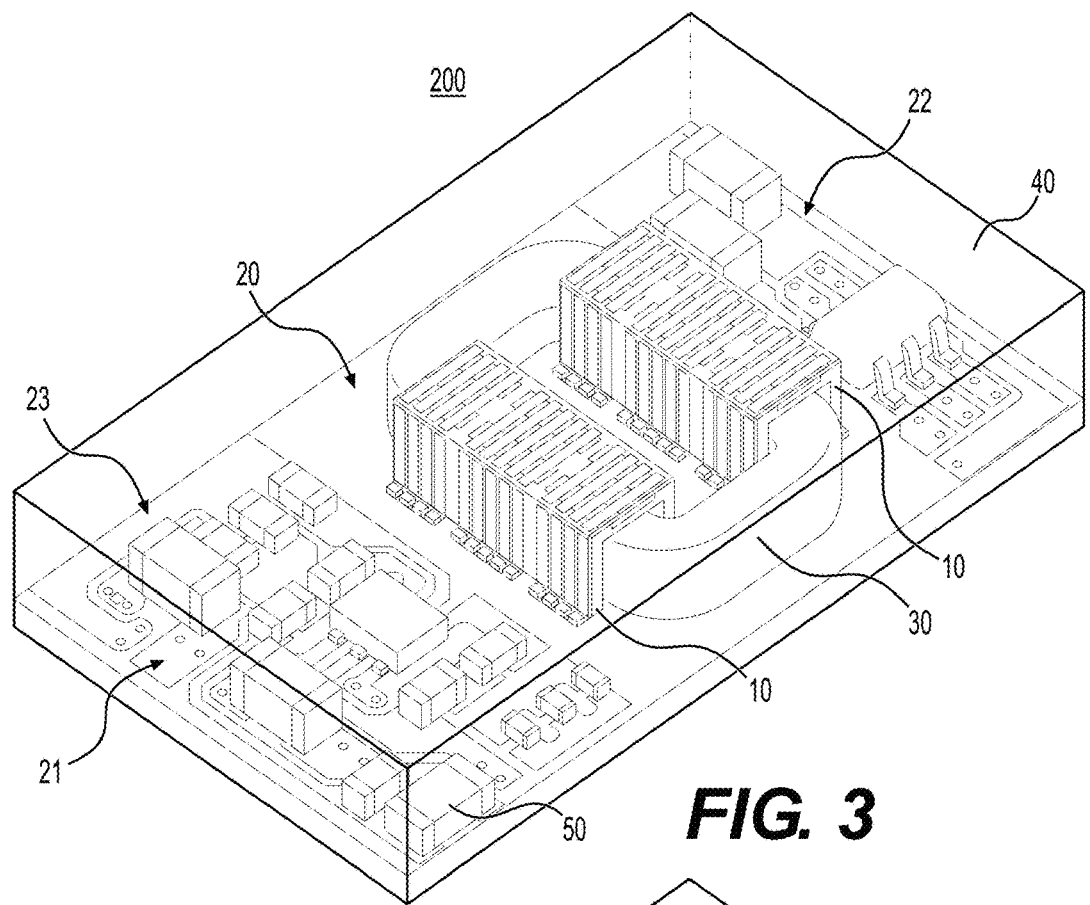
FIG. 3 is a top perspective view of block coils mounted to a PCB of the magnetic component of FIG. 1 in an electronic module.
Figure 4:
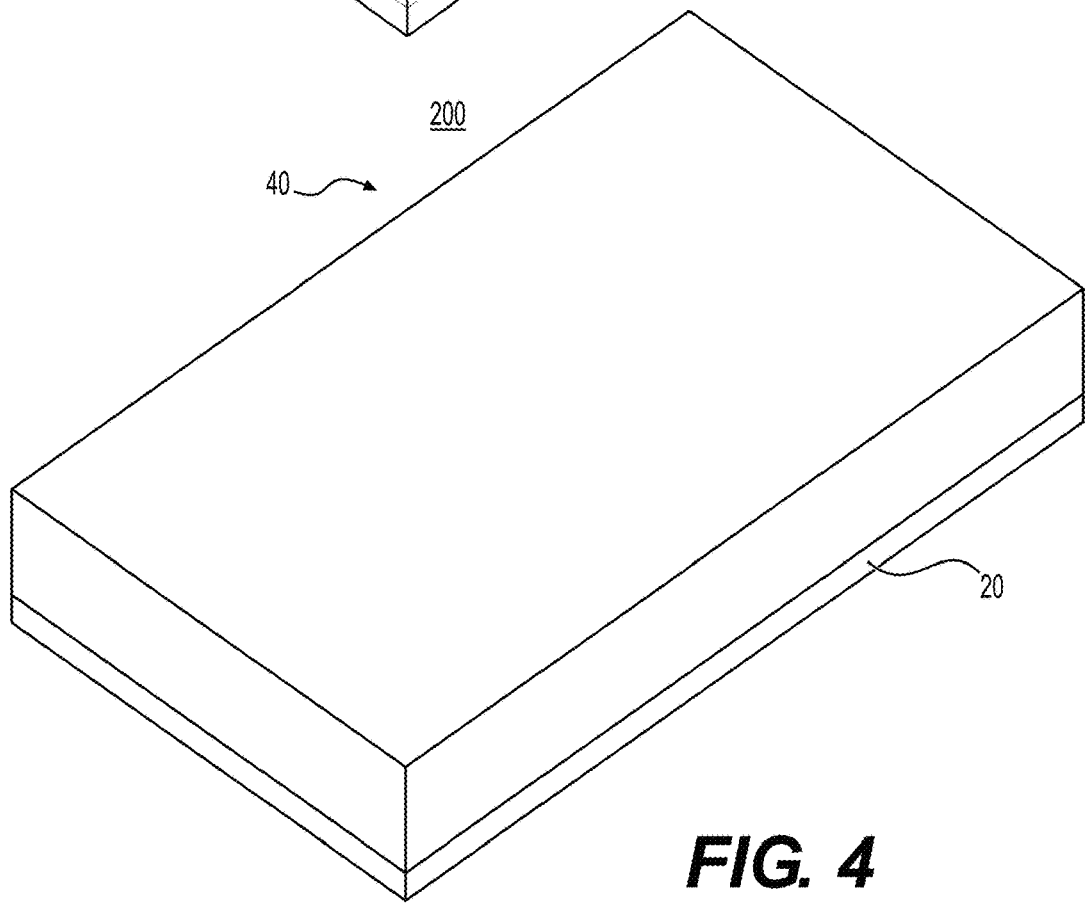
FIG. 4 is a top perspective view of the electronic module of FIG. 3 with insulating material covering the block coils.
Figure 5:
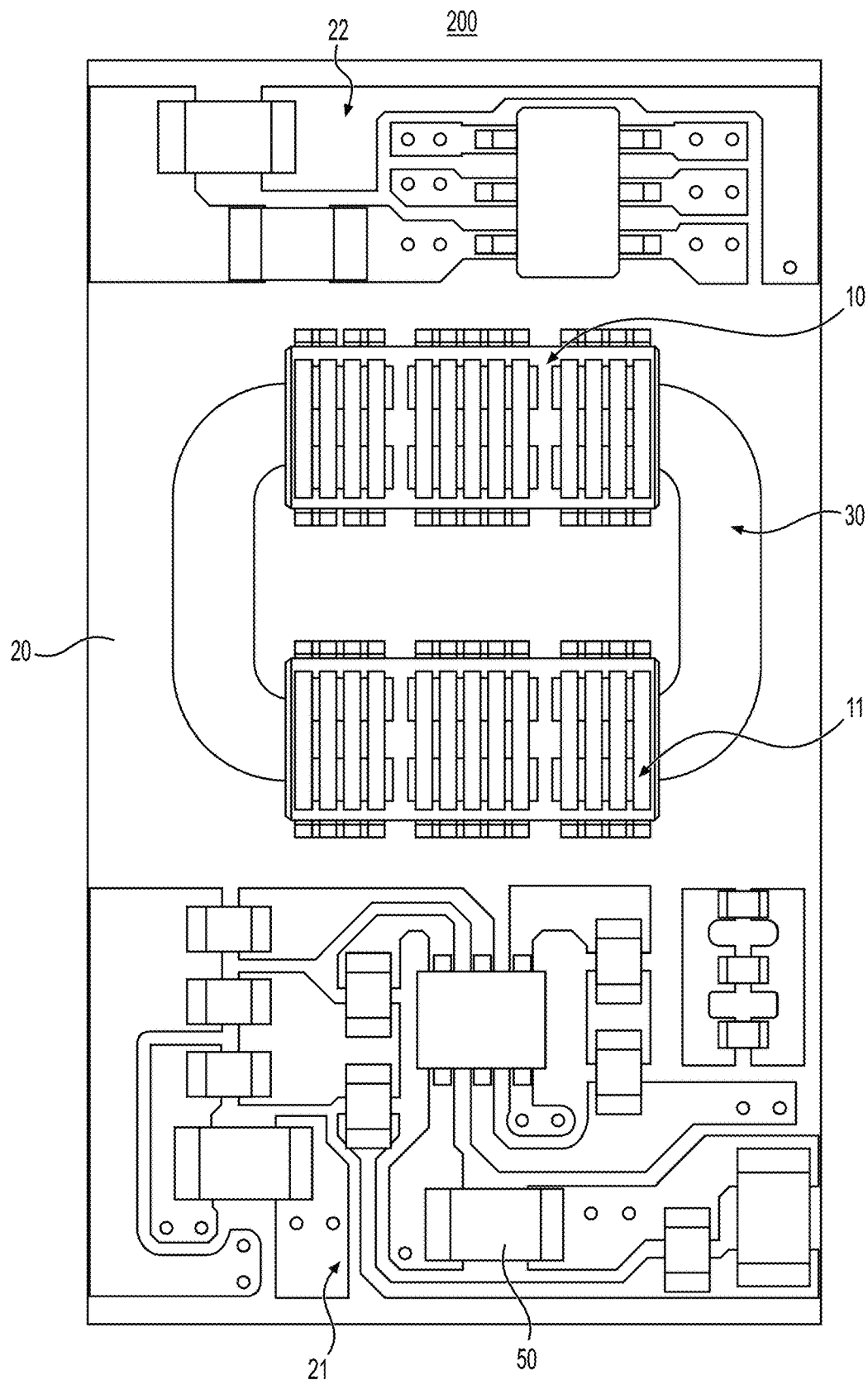
FIG. 5 is a top view of the electronic module of FIG. 3.

FIGS. 1 and 2 shows a magnetic component 100 that includes a substrate 20, a magnetic core 30, and two block coils 10. FIGS. 3-5 show an electronic module 200 that includes the magnetic component 100 of FIG. 1 and additional electronic component(s) 50. Although two block coils 10 are shown in FIG. 1-5, any number of block coils 10 can be used, including a single block coil 10.

The magnetic component 100 can include one or more windings that wind around the magnetic core 30. For example, the magnetic component 100 can include a primary winding and a secondary winding that both extend around the magnetic core 30. Each winding can include one or more terminals 11 in a block coil or block coils 10 and can include one or more traces or conductive patterns 23 on or in the substrate 20.

Figure 9:
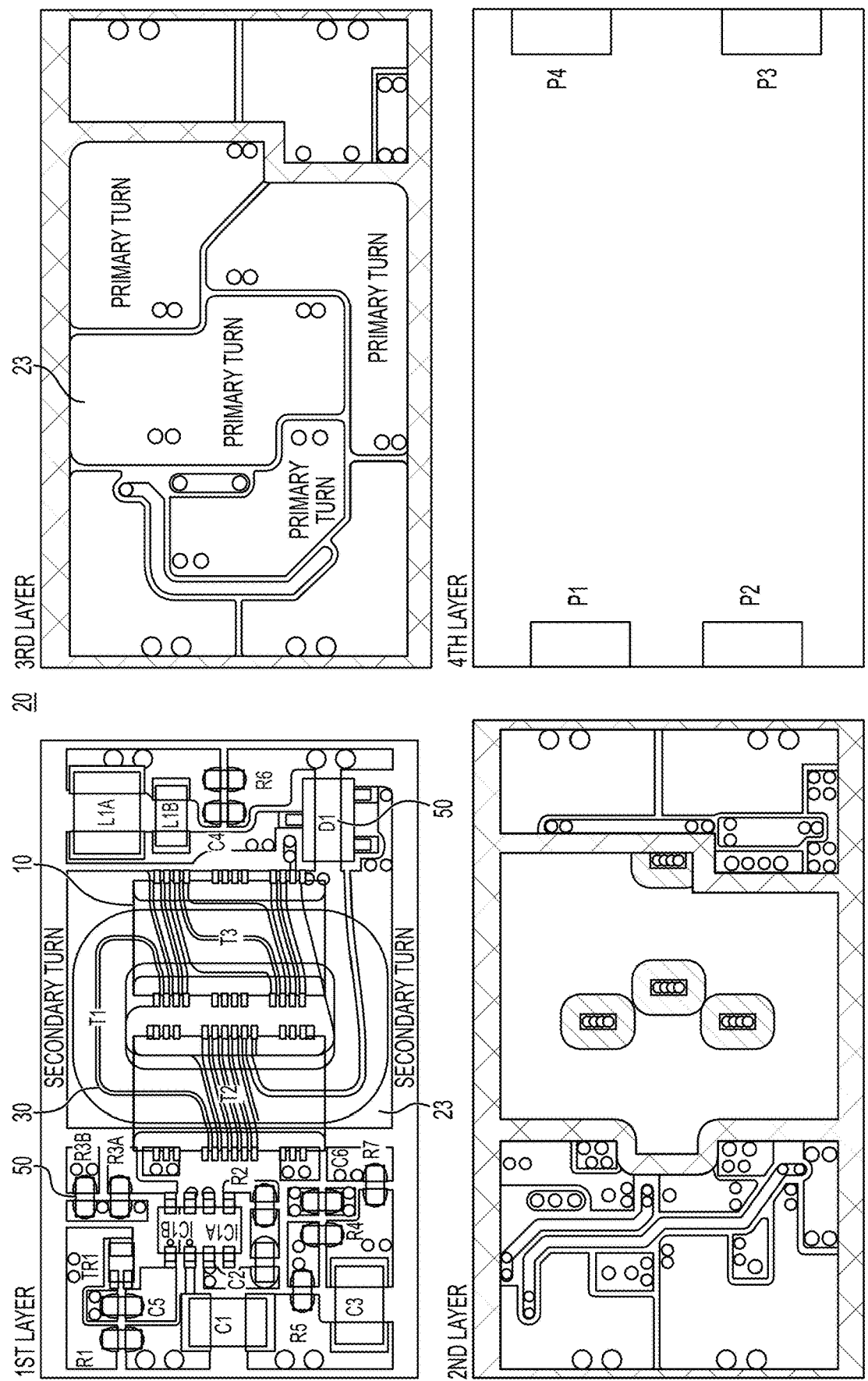
FIG. 9 shows top views of different layers of the PCB that can be used with the electronic module of FIG. 3.

The substrate 20 can be any suitable substrate, including, for example, a printed circuit board (PCB). The substrate 20 can include a single layer or multiple layers and can include traces or conductive patterns 23 on an exterior surface (i.e., the top and the bottom surfaces) of the substrate 20 and/or in the substrate 20 (i.e., on an internal layer of the substrate 20). If the substrate 20 includes a single layer, then the traces or conductive patterns 23 of both the primary winding and the secondary winding can be located on the same layer, e.g., the top surface of the substrate 20. If the substrate 20 includes multiple layers, then the traces or conductive patterns 23 of the primary winding and the secondary winding can be located on the same layer or can be located on different layers. FIG. 9 shows four possible layers of the substrate 20. Although four layers are shown in FIG. 9, any number of layers can be used, including one layer.

As shown in FIG. 3 (in FIG. 3, the insulating material 40 is shown as transparent) and FIG. 4 (in FIG. 4, the insulating material 40 is not transparent), an insulating material 40 can be applied to the electronic module 200 to cover the substrate 20, the magnetic core 30, the two block coils 10, and any additional electronic component(s) 50. Any suitable insulating material 40 can be used, including, for example, a molding compound or an epoxy. The insulating material 40 can be applied in any suitable manner. The insulating material 40 can improve and help maintain isolation between the primary and the secondary circuit of the magnetic component 100. Insulating material 40 can also be applied to the magnetic component 100 of FIG. 1.

In FIGS. 1 and 2, no additional electronic components 50 are shown on the substrate 20, but as shown for the electronic module 200 of FIGS. 3 and 5, additional electronic component(s) 50 can be included on the substrate 20. The electronic component(s) 50 can be active components, such as transistors, integrated circuits (ICs), etc., or can be passive components, such as resistors, capacitors, inductors, etc. The electronic component(s) 50 can be connected to the same surface as the magnetic core 30 as shown in FIGS. 3 and 5 and/or can be connected to the opposite surface as the magnetic core 30 (not shown). For example, locating capacitors on a surface of the substrate 20 opposite to the magnetic core 30 can contribute to (i) the "miniaturization" of electronic module 200 and (ii) prevent or greatly reduce short circuiting.

The electronic module 200 can be, for example, a power converter, isolator, or transformer, and the electronic components 50 can be the components of the power converter, isolator, or transformer. The electronic module 200 can be any suitable power converter, including, for example, a DC-DC converter or an AC-DC converter. For example, if the electronic module 200 is an isolated DC-DC converter, then, as shown in FIGS. 3 and 5, electronic components 50 of a primary circuit 21 located on a first side of an isolation barrier can be located at one end of the substrate, and electronic components 50 of a secondary circuit 22 located on a second side of the isolation barrier can be located at the opposite end of the substrate 20.

Figure 16:
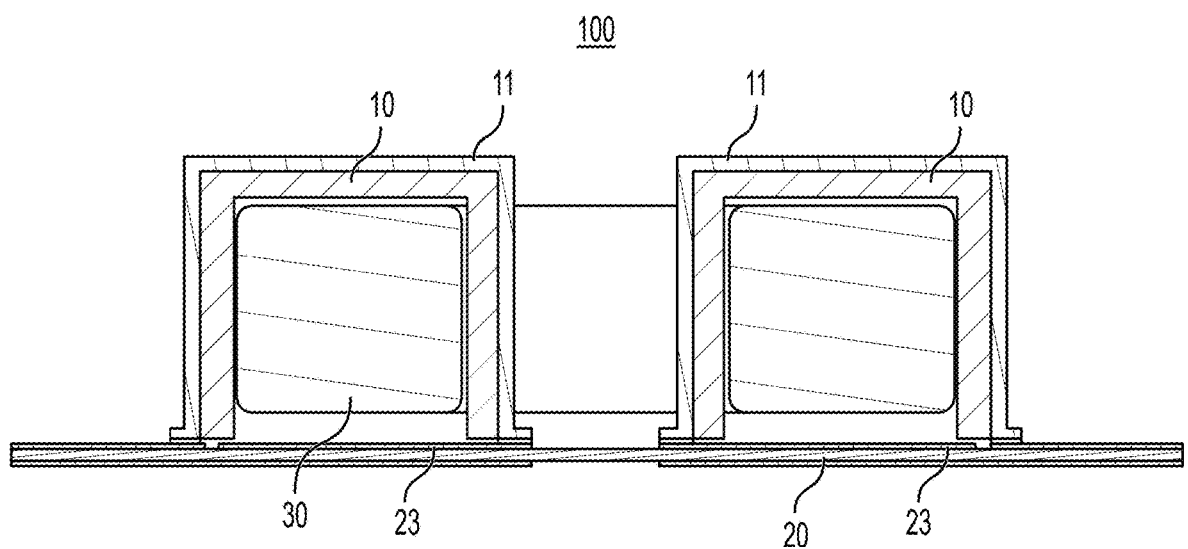
FIG. 16 is a sectional view of block coil mounted to a single-layer substrate of an electronic component.

FIG. 16 shows a similar magnetic component 100 as FIGS. 1 and 2, but the substrate 20 in FIG. 16 includes a single-layer substrate.

Figure 10:
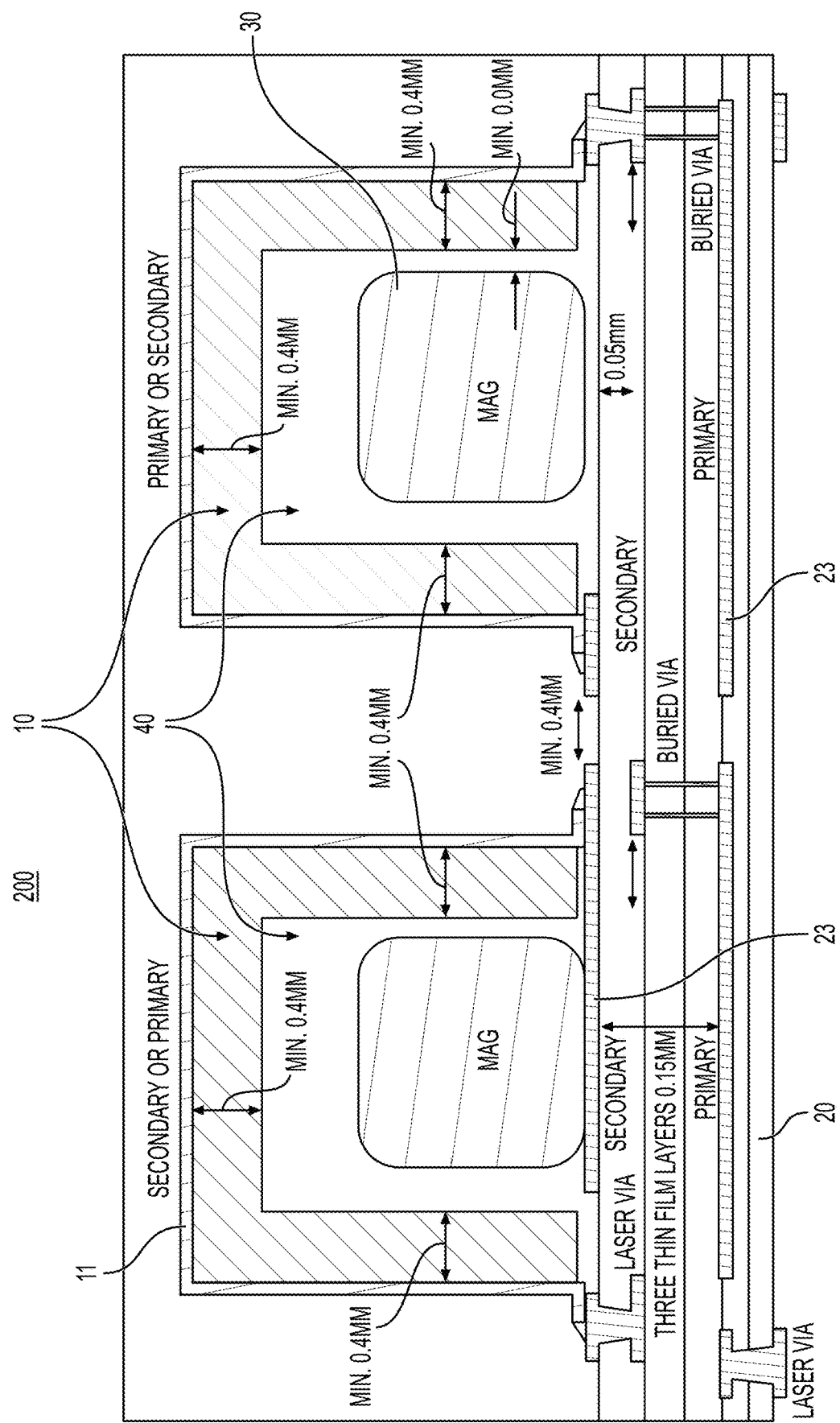
FIG. 10 is a partial sectional view of the electronic module of FIG. 4 with insulating material covering the block coils.

In FIG. 9, the $1^{st}$ layer of the substrate 20 shows the top surface of an electronic module 200 on which the magnetic core 30 can be located and to which the block coils 10 and the electronic components 50 can be attached. The $1^{st}$ layer can include traces or conductive patterns 23 that connect the electronic components 50. The traces 23 of the primary winding (i.e., primary traces or primary conductive patterns) and the traces 23 of the secondary winding (i.e., secondary traces or secondary conductive patterns) can be located on different layers of the substrate 20 as shown in FIG. 9 or can be located on the same layer of the substrate 20. For example, the primary traces 23 can be located on the $3^{rd}$ layer of the substrate 20, and the secondary traces 23 can be located on the $1^{st}$ layer. The primary traces 23 and the secondary traces 23 can be separated by one or more layers. In FIG. 9, the primary traces 23 and the secondary traces 23 are separated by the $2^{nd}$ layer of the substrate 20. In the cross-sectional view of FIG. 10, the primary traces 23 and the secondary traces 23 are separated by three thin film layers for a total separation of 0.15 mm. The hatched areas in FIG. 9 are keep-out areas, but other keep-out area arrangements are also possible. For example, the area on the $1^{st}$ layer between the feet 12 of the terminals 11 of the block coils 10 can also be a keep-out area, which as shown in FIG. 10 includes a keep-out area with a minimum width of 0.4 mm between the block coils 10. The outer layer of the substrate 20 can include input/output (I/O) terminals P1, P2, P3, P4 that can be used to connect the electronic module 200 to a host substrate (not shown). I/O terminals P1, P2 can be connected to an input voltage, and I/O terminals P3, P4 can provide an output voltage.

Figure 17:
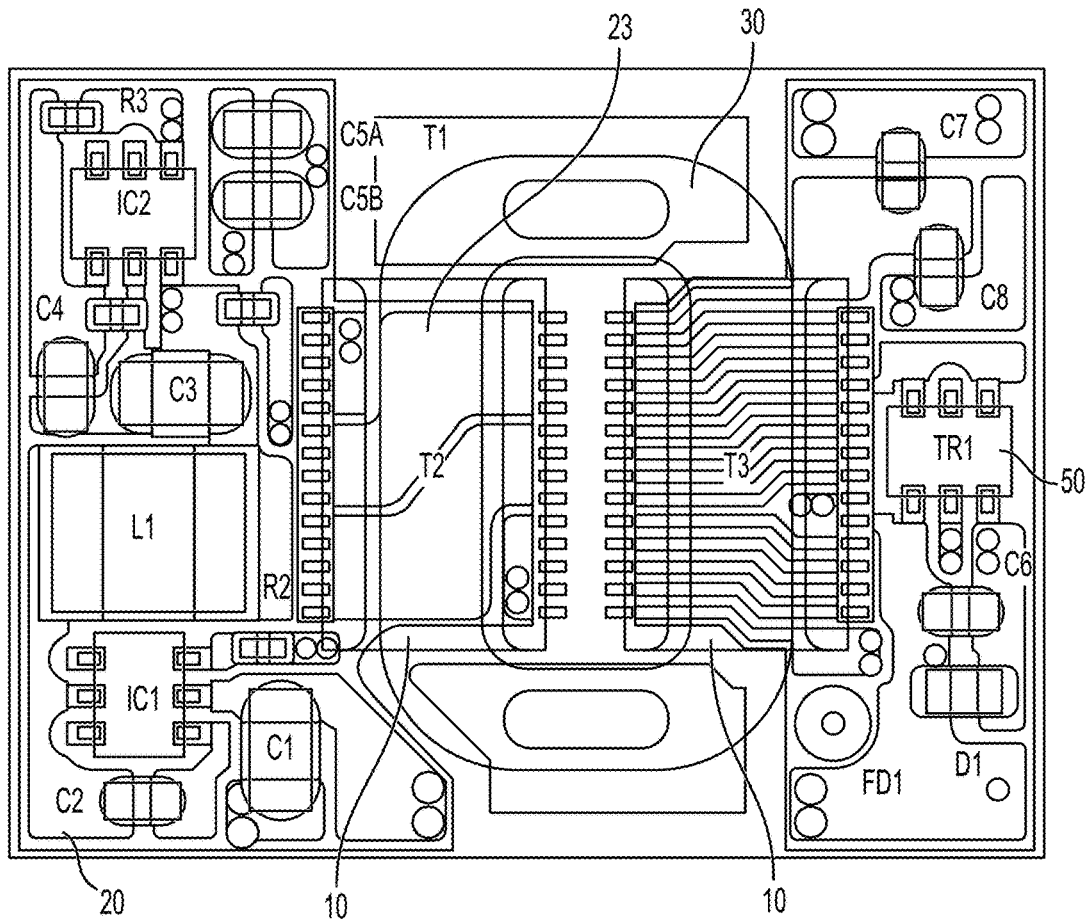
FIG. 17 is a top view of the top layer of the substrate of FIG. 16.

As shown in FIG. 9, one or more terminals 11 of each block coils 10 can be connected to a trace 23. For example, in one of the block coils 10, a single secondary trace 23 can connect a foot of one secondary terminal 11 to a foot of another secondary terminal 11 to define a single turn of the secondary winding, or in one of the block coils 10, a primary trace 23 can connect the feet 12 of three primary terminals 11 to the feet 12 of three other primary terminals 11 to define a single turn of the primary winding. That is, it is possible for a single turn of a winding to include one or more terminals 11 connected by a single trace 23. FIG. 17 shows a possible circuit arrangement of an electronic module 200 including either (a) a single-layer substrate 20 or (b) a multi-layer substrate 20 in which the electronic component(s) 50 and all of the traces 23 are on the top surface of the substrate 20. As in FIG. 9, one or more terminals 11 of each block coil 10 can be connected to a trace 23. The traces 23 on the substrate 20 can determine how many terminals 11 are included in a single turn and can determine how many turns are in either the primary or the secondary winding. Thus, the same block coil 10 can be used in different applications, which can save design costs because a different block coil 10 does not have to be made for each application.

The magnetic core 30 can have any suitable shape including the ring shape shown in FIGS. 1-3 and 5 or other suitable shapes such as E-I or E-E magnetic core 31 as shown in FIG. 24, a straight or rod-shaped magnetic core 32 as shown in FIG. 25, oval-shaped magnetic core (not shown), etc. The magnetic core 30, 31, 32 can include any suitable magnetic material, including, for example, ferrite. The magnetic core 30, 31, 32 can be coated or uncoated. Coating the magnetic core 30, 31, 32 can improve isolation. The coating can be any suitable material, including, for example, epoxy resin, polyimide, etc. The magnetic core 30, 31, 32 can be attached to the substrate 20 or the block coil(s) 10. If the magnetic core 30, 31, 32 is attached the block coil(s) 10, then the magnetic core 30, 31, 32 can be attached to an inner, upper surface of the block coil(s) 10.

Figure 6:
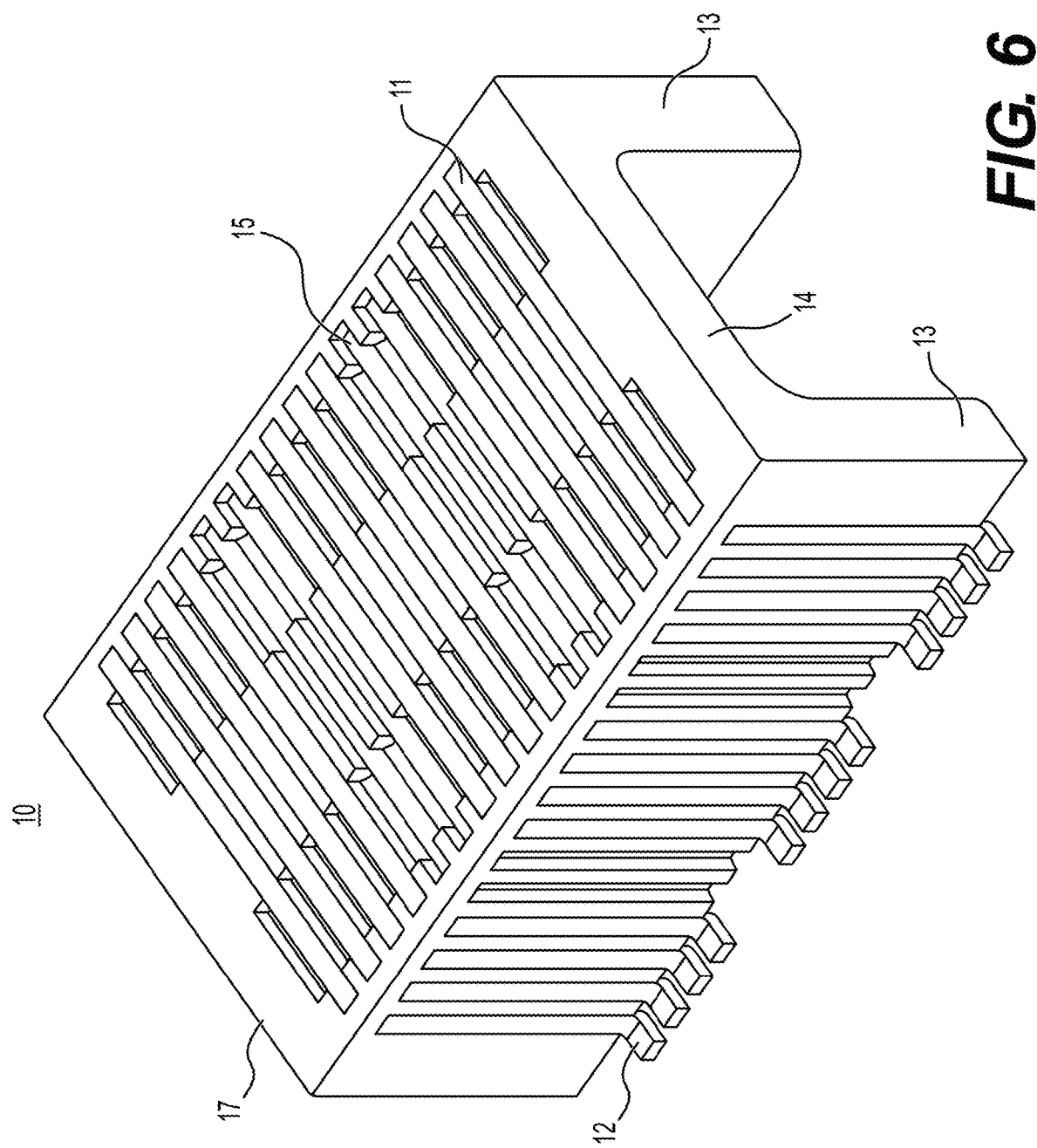
FIG. 6 is top perspective view of the block coil of FIG. 1.
Figure 7:
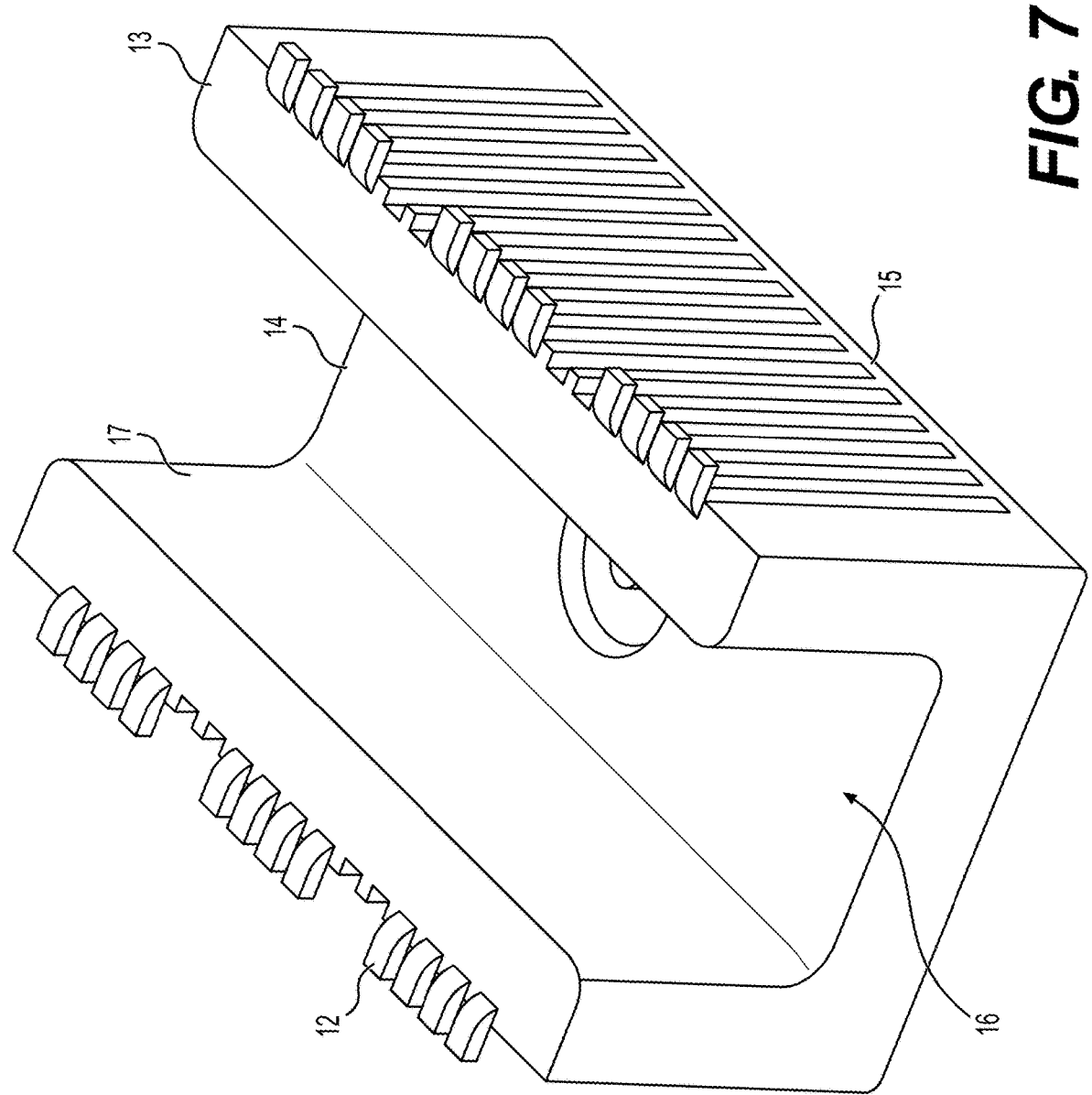
FIG. 7 is bottom perspective view of the block coil of FIG. 1.

FIGS. 6 and 7 show the block coil 10. The block coil 10 can include a resin body 17 and terminals 11. The resin body 17 can include two legs 13 connected by a bridge 14 to define a cavity or groove 16 that receives a portion of the magnetic core 30. The resin body 17 can have a U-shape as shown in FIGS. 6 and 7 or can have any suitable shape such that the resin body 17 extends over or bridge the magnetic core 30. The resin body 17 can extend over three sides of a cross section of the magnetic core 30. The resin body 17 can include slots 15 in which the terminals 11 can be located or embedded in and can define a flat pick-up surface that a pick-and-place machine can use to precisely place the block coil 10 on a substrate 20 in one motion. That is, multiple turns of the winding(s) can be created with one motion. In addition, the block coil 10 provides a structure that protects the terminals 11 and prevents or greatly reduces any chance of short-circuiting. Because the resin body 17 allows different arrangements of terminals 11 to be used with the same resin body 17, the same resin body 17 can be used in different applications, which can save design costs because a different resin body 17 does not have to be made for each application. For example, if the resin body 17 is made by a molding process, then the same mold can be used for different applications, saving design costs. In FIGS. 6 and 7, the slots 15 in the resin body 17 are visible, but in the finished product, the slots 15 may not be visible, for example, if a resin mold is used that fills the gaps in the slots 15.

The resin body 17 can be made of any suitable insulating material, including, for example, liquid crystal polymer (LCP) resin, and can be made in any suitable manner. The terminals 11 can be made of any suitable conductive material, including, for example, copper or copper alloy.

FIG. 6 shows twelve terminals 11 and four empty slots 15. Any number of terminals 11 can be used, including, for example, 14, 16, 18, 20, or more than 20 terminals. The terminals 11 can have a U-shape as shown in FIGS. 6 and 7 or can have any suitable shape such that the terminals 11 extend over or bridge the magnetic core 30. The terminals 11 can extend over three sides of a cross section of the magnetic core 30. The terminals 11 can include feet 12 that can be surface mounted to the substrate 20. Alternatively, the terminals 11 can be connected to the substrate 20 in any suitable manner. The feet 12 of the terminals 11 can be attached to the substrate 20 such that the block coil 10, including the resin body 17, is located on or above the substrate 20. The terminals 11 can be located or embedded in slots 15 in the block coil 10. As shown in FIG. 6, not all of the slots 15 have to have a corresponding terminal 11. In FIG. 6, four slots 15 do not have a corresponding terminal 11, but any number of slots 15 could be empty. FIG. 6 shows sixteen slots 15, but any number of slots 15 could be used.

The terminals 11 in the block coil 10, along with traces 23 on or in the substrate 20, can be included in the windings of the magnetic component 100. If the windings include primary windings and secondary windings, then some terminals 11 can be included in the primary winding and be connected to primary traces 23, and some terminals 11 can be included in the secondary winding and be connected to secondary traces 23. Alternatively, all of the terminals 11 in the block coil 10 either can be included in the primary winding and be connected to primary traces 23 or can be included in the secondary winding and be connected to secondary traces 23. If all of the terminals 11 in one block coil 10 are included in the primary winding, then all of the terminals 11 in another block coil 10 can be included in the secondary winding, and vice versa. If all of the terminals 11 in one block coil 10 are included in the primary winding, then another block can include terminals 11 in both the primary winding and the secondary winding, and vice versa.

The terminals 11 in a block coil 10 can be included in groups. Which terminal group each terminal 11 belongs to is determined by the traces 23 on the substrate 20. For example, with one substrate 20, all of the terminals 11 might belong to a first terminal group, while with another substrate 20, the adjacent terminals 11 might be in two different terminal groups, either a first terminal group or a second terminal group. For example, FIG. 6 shows two terminal groups, i.e., first and second terminal groups. In FIG. 6, the first terminal group includes four first terminals 11 on each end of the block coil 10, and the second terminal group includes four second terminals 11 in the middle of the block coil 10 in between the first terminals 11 of the first terminal group. Other arrangements are also possible. For example, the first and second terminals 11 can alternate along the length of the block coil 10 such that each terminal 11 of one terminal group can be between two terminals 11 of the other terminal group. Alternatively, the terminal groups do not have to be split. That is, the terminals 11 of the first terminal group can be located on one end of the block coil 10 (e.g., seven first terminals 11 on one end), and the terminals 11 of the second terminal group can be located on the other end of the block coil 10 (e.g., seven second terminals 11 on the other end with two slots 15 in the middle without any terminals 11). The terminals 11 can also be arranged in a bifilar arrangement in which two windings are arranged next to each other. For example, adjacent terminals 11 can be connected to either a first primary winding or a second primary winding.

Each terminal 11 of the first or the second terminal group can be closer to an adjacent terminal 11 of the same group than a terminal 11 of the other group. That is, each first terminal 11 can be closer to another first terminal 11 than any second terminal 11, and each second terminal 11 can be closer to another second terminal 11 than any first terminal 11. Slots 15 between adjacent terminal groups can be empty (i.e., the number of terminals 11 can be reduced or thinned) to help improve isolation between the first and second terminal groups. More empty slots 15 between adjacent terminal groups can increase the isolation between the terminal groups. The adjacent terminal groups can be spaced away from each other. Instead of including empty slots 15, adjacent terminal groups can be spaced farther apart from each other than adjacent terminals 11 in a terminal group. For example, adjacent terminal groups can be spaced apart twice the distance that adjacent terminals 11 in a terminal group are spaced part, with no empty slots 15 between the adjacent terminal groups.

Figure 8:
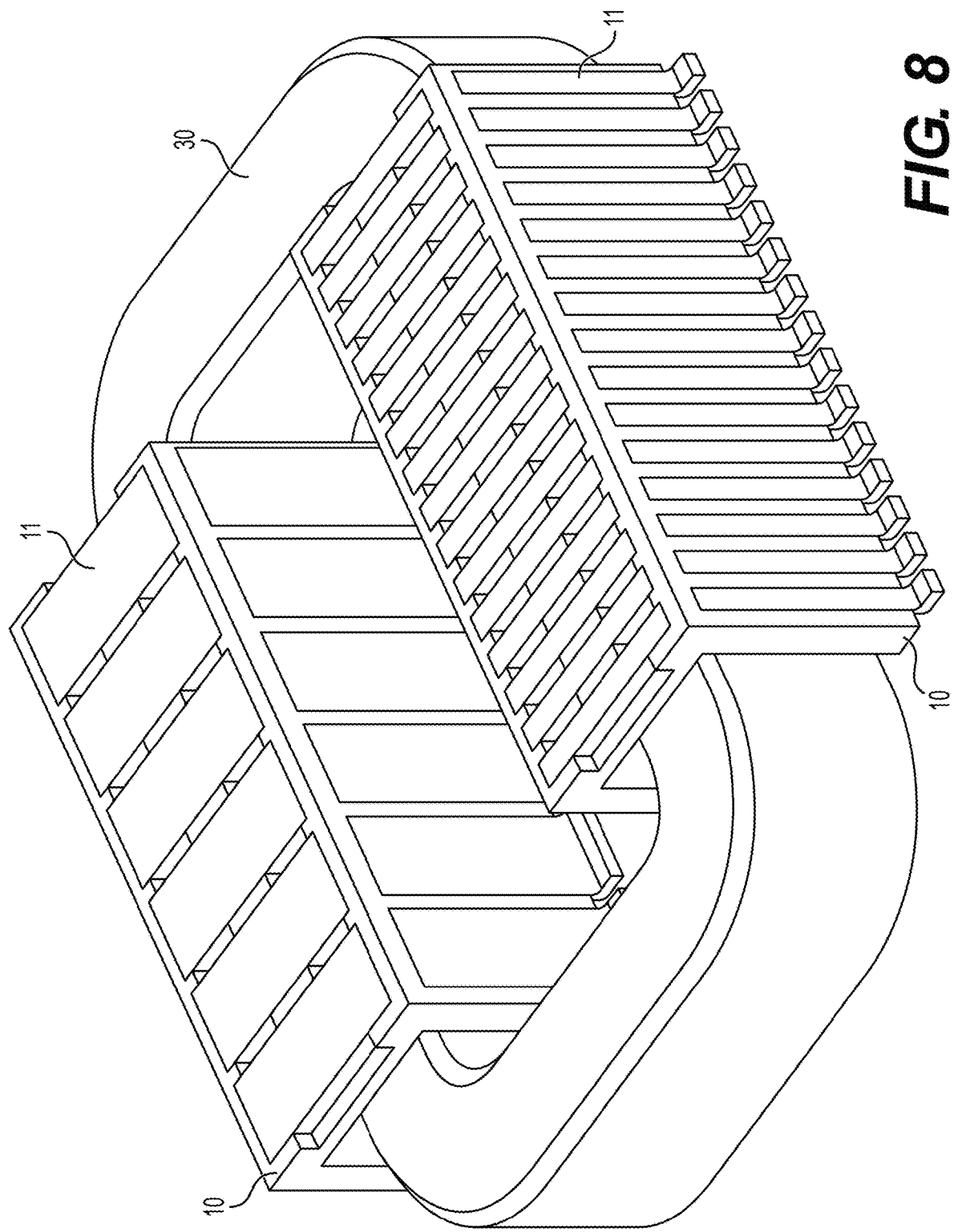
FIG. 8 is a top perspective view of block coils with terminals with different widths.

FIG. 8 shows two block coils 10 with terminals 11 with different widths. As shown in FIG. 8, the terminals 11 of each block coil 10 can have the same width. Alternatively, the terminals 11 with different widths can be included in the same block coil 10.

FIG. 10 shows the cross-section of two block coils 10 connected to a multi-layer substrate 20. FIG. 10 shows various minimum distances that ensure adequate isolation. For example, the walls of the resin body 17 should be at least 0.4 mm thick so that the terminals 11 are at least 0.4 mm from the cavity or groove 16 within the block coil 10. If the magnetic core 30 is coated, then 0.4 mm wall thickness can be reduced, for example, to 0.2 mm. The isolation distance will depend on the application. The minimum distance between the magnetic core 30 and the walls of the resin body 17 can be 0.0 mm so that there is no distance between the magnetic core 30 and the walls of the resin body 17. On the surface of substrate 20, the minimum distance between the traces or conductive patterns 23 of the primary and secondary circuits should be at least 0.4 mm.

Figure 18:
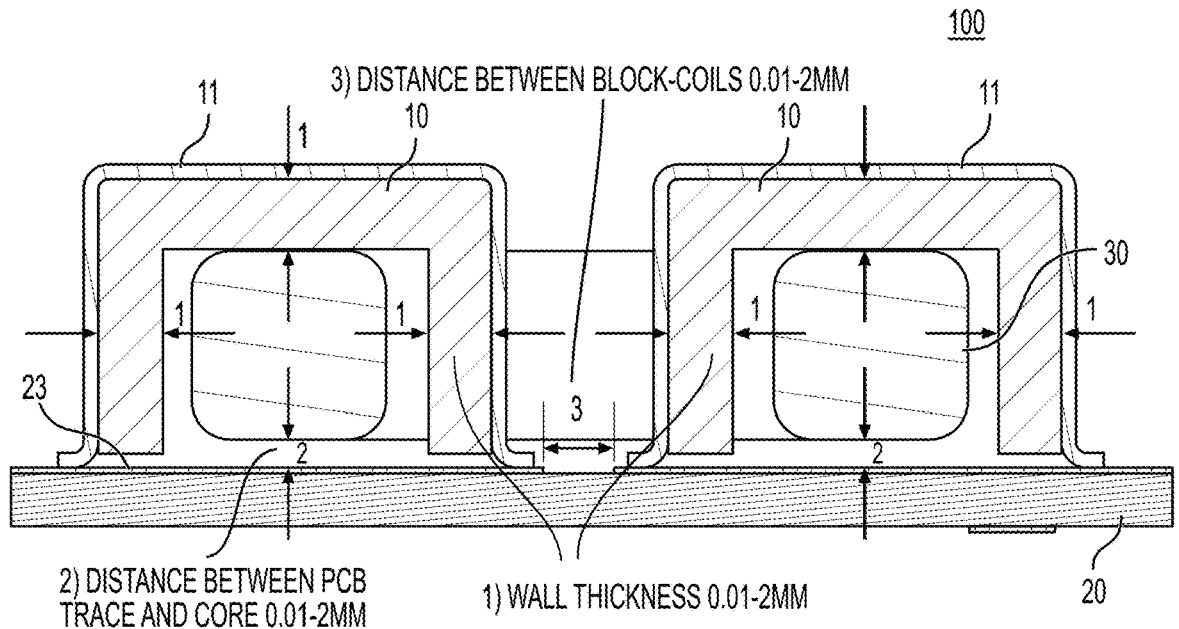
FIG. 18 is a sectional view of a magnetic component showing various distances.

As shown in FIG. 10, the substrate 20 can include laser vias that can be created by laser and that do not have to extend all the way through the substrate 20 and can include buried vias that extend between internal layers of the substrate 20 but that do not extend the external surfaces of the substrate 20. Each of the multiple layers of the substrate 20 can be 0.05 mm or approximately 0.05 mm within manufacturing and/or measurement tolerances. As shown in FIG. 10, the primary traces 23 and the secondary traces 23 can be separated by three internal layers such that the total distance between the primary traces 23 and the secondary traces 23 is at least 0.15 mm to ensure adequate isolation. Although a minimum distance of 0.4 mm between the primary and the secondary circuits is required on the surface of a substrate 20, the minimum distance between the primary and the secondary circuits inside of the substrate 20 depends on isolation requirement of each product. Other distances are also possible. For example, in FIG. 18, distance 1 is the thickness of the walls of the block coil 10 and can be about 0.01 mm to about 2.0 mm, within manufacturing and/or measurement tolerances; distance 2 is the distance between the trace 23 on the top layer of the substrate 20 and the magnetic core 30 and can be about 0.01 mm to about 2.0 mm, within manufacturing and/or measurement tolerances; and distance 3 is the smallest distance between the between the block coils 10 (which is the distance between the feet 12 of the terminals 11 in FIG. 18) and can be about 0.01 mm to about 2.0 mm, within manufacturing and/or measurement tolerances.

Figure 29:
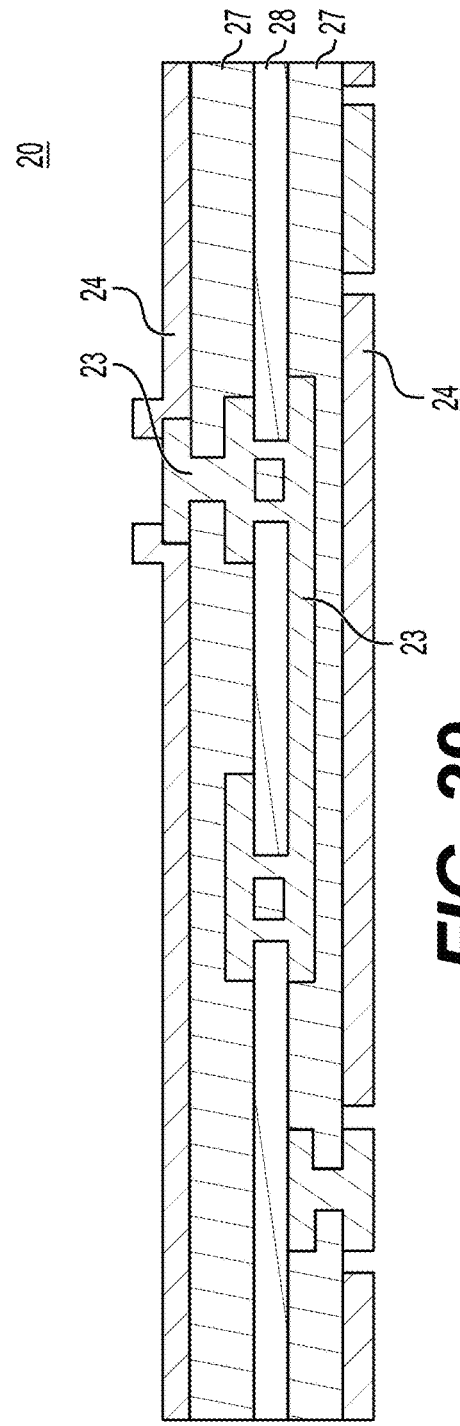
Figure 30:
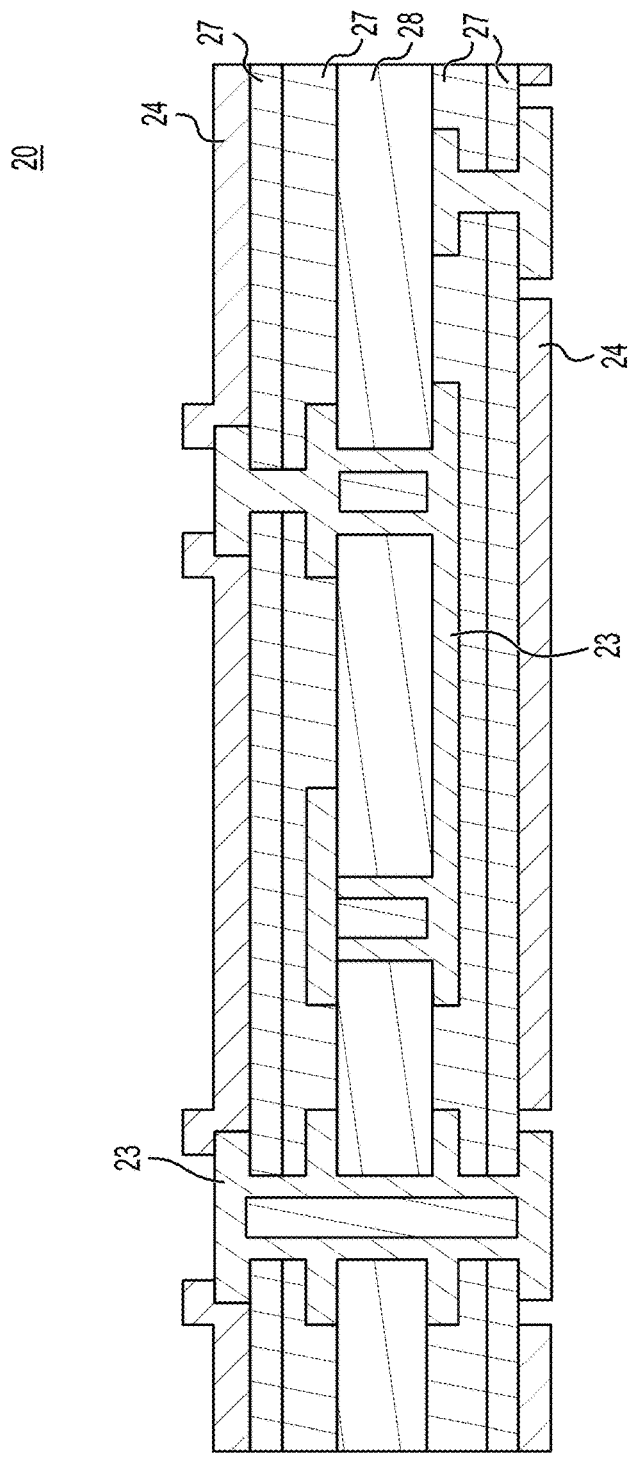
Figure 31:
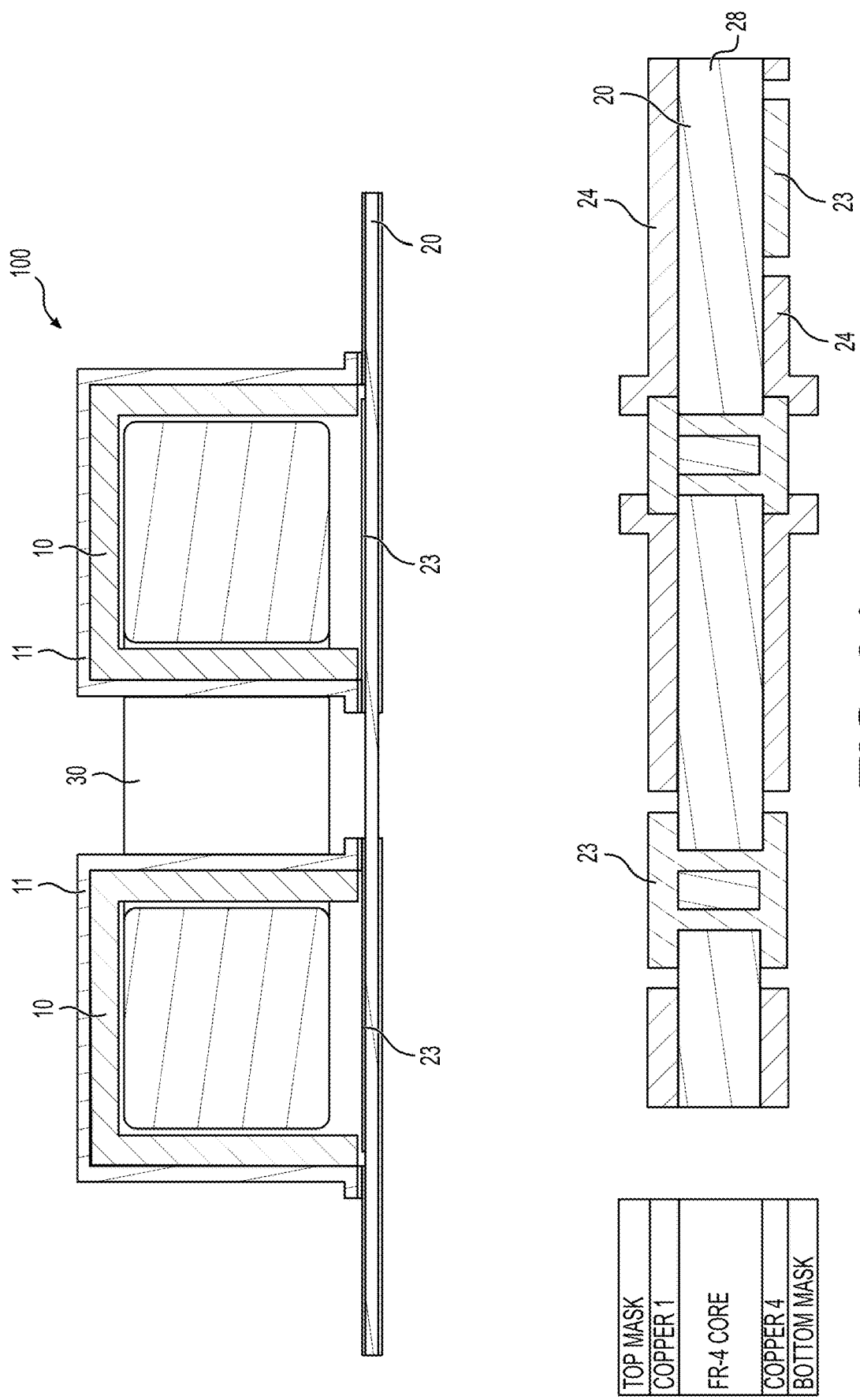

FIGS. 26-31 show different possible substrates 20 that can be used in either a magnetic component 100 or in an electronic module 200. FIGS. 26-30 show different possible multi-layer substrates 20, while FIG. 31 shows a single-layer substrate 20. As shown in FIGS. 26-30, the substrate 20 can include multiple layers, including a top mask 24, one or more pre-preg layers 27, a core layer 28, one or more pre-preg layers 27, and a bottom mask 24. The core layer 28 can also include a core pre-preg layer 28a. The core layer 28 can include any suitable material, including, for example, FR-4. Traces 23 can be included on the top and bottom surfaces of the substrate 20 and can be included in interior layers of the substrate 20. The traces 23 on different layers can be connected by vias. The vias can include a hole in the substrate 20 that is plated with a conductive material, including, for example, a metal or metal alloy, and filled with any suitable material, including, for example, a resin. Alternatively, the vias can be filled with only conductive material. The vias can be made in any suitable manner, including, for example, mechanical drilling or laser drilling. Any suitable vias can be used, including, buried vias in which neither side of the vias is exposed on the top or bottom surface of the substrate 20, blind vias in which one side of the vias is exposed on the top or bottom surface of the substrate 20, and through-hole vias in which both sides of the vias are exposed on either the top or the bottom surface of the substrate 20. The traces 23 can include copper or other suitable conductive material. Similarly, as shown in FIG. 31, the substrate 20 can include a single layer, including a a top mask 24, a core layer 28, and a bottom mask 24. The traces 23 in FIG. 31 can be located on the top or the bottom surfaces of the substrate 20.

Figure 26:
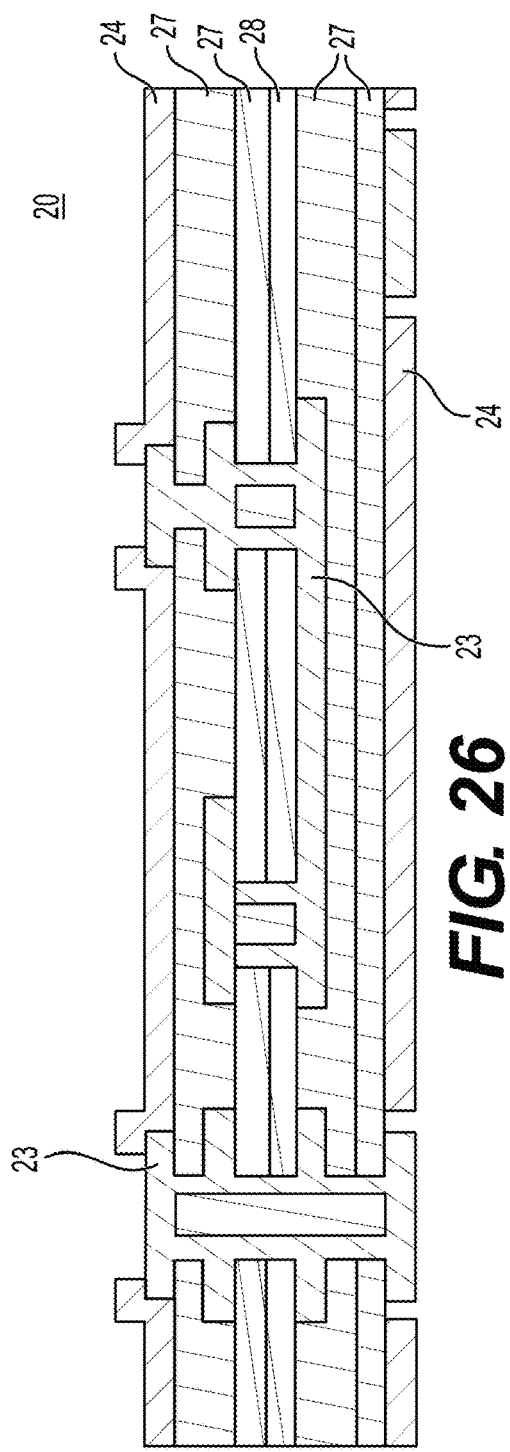
FIGS. 26-31 show example substrates that can be used in the magnetic component of FIG. 1 and the electronic module of FIG. 3.

FIG. 26 shows a multi-layer substrate 20 that includes a top mask 24, a pre-preg layer 27, a core pre-preg layer 28a, a core layer 28, two pre-preg layers 27, and a bottom mask 24. Traces 23 are located on the top and bottom surfaces of the substrate 20, the top surface of the core pre-preg layer 28a, and the bottom surface of the core layer 28.

Figure 27:
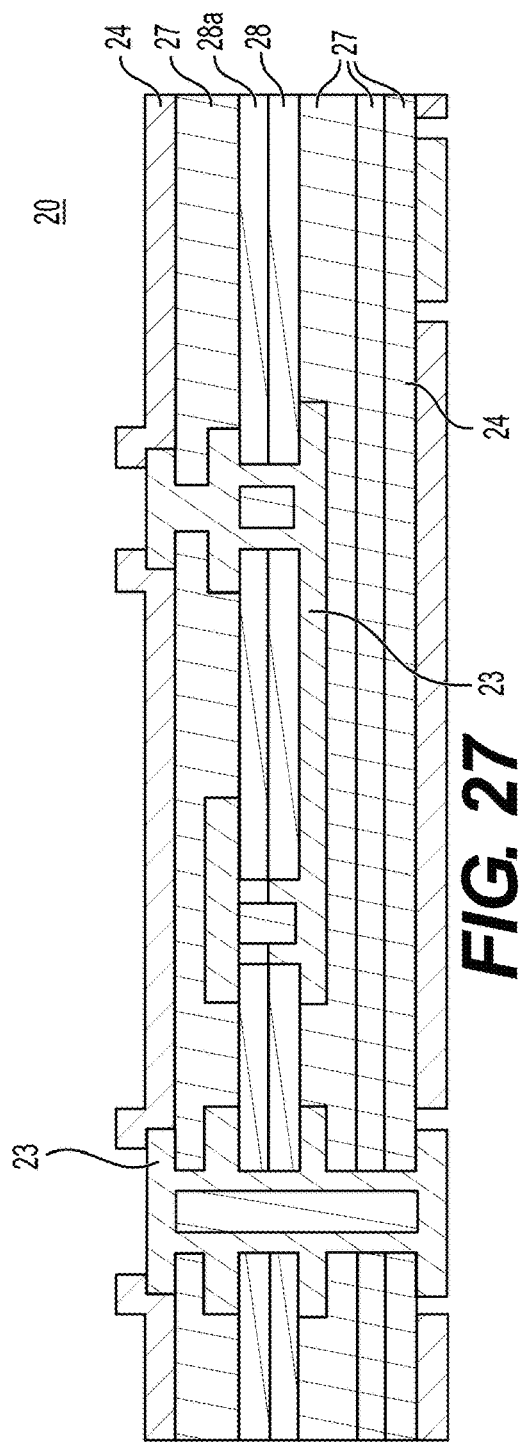

FIG. 27 shows a multi-layer substrate 20 that includes a top mask 24, a pre-preg layer 27, a core pre-preg layer 28a, a core layer 28, three pre-preg layers 27, and a bottom mask 24. Traces 23 are located on the top and bottom surfaces of the substrate 20, the top surface of the core pre-preg layer 28a, and the bottom surface of the core layer 28.

Figure 28:
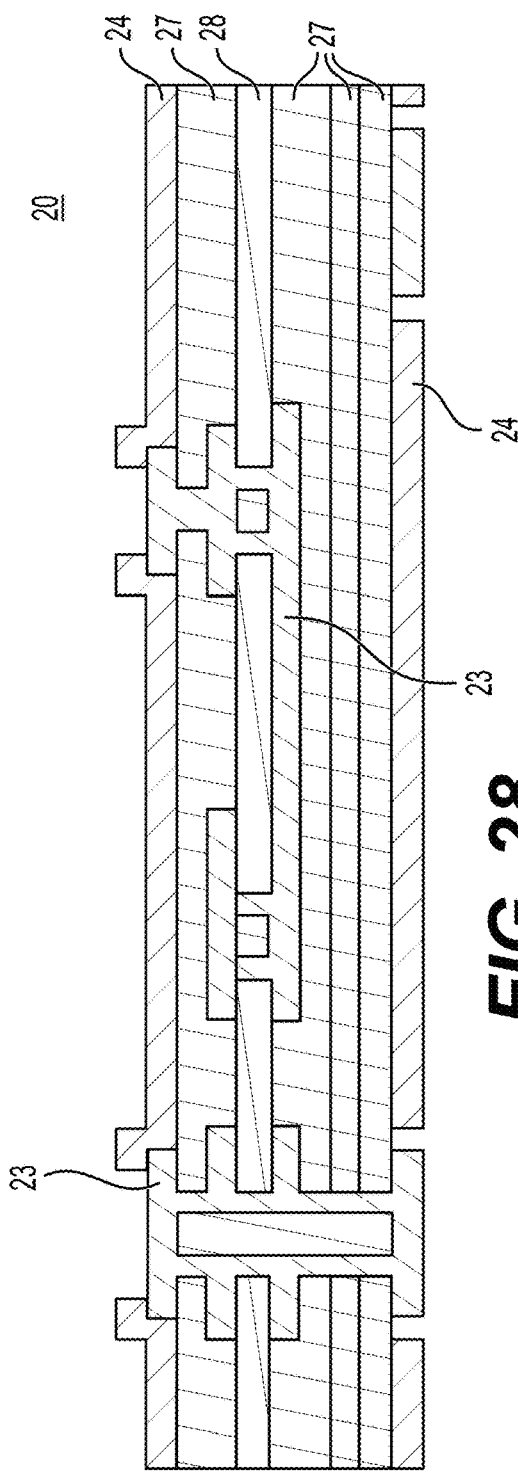

FIG. 28 shows a multi-layer substrate 20 that includes a top mask 24, a pre-preg layer 27, a core layer 28, three pre-preg layers 27, and a bottom mask 24. Traces 23 are located on the top and bottom surfaces of the substrate 20 and the top and bottom surfaces of the core layer 28.

FIG. 29 shows a multi-layer substrate 20 that includes a top mask 24, a pre-preg layer 27, a core layer 28, a pre-preg layer 27, and a bottom mask 24. Traces 23 are located on the top and bottom surfaces of the substrate 20 and the top and bottom surfaces of the core layer 28.

FIG. 30 shows a multi-layer substrate 20 that includes a top mask 24, two pre-preg layers 27, a core layer 28, two pre-preg layers 27, and a bottom mask 24. Traces 23 are located on the top and bottom surfaces of the substrate 20 and the top and bottom surfaces of the core layer 28.

The multi-layer substrate in FIGS. 26-30 makes it easier to locate the primary and the secondary traces or conductive patterns 23 and to provide insulation between the primary and the secondary traces or conductive patterns 23. If multiple block coils 10 are used, then the multi-layer substrate in FIGS. 26-30 can make it easier to provide isolation between the primary and the secondary traces or conductive patterns 23.

The bottom portion of FIG. 31 shows a single-layer substrate 20 that includes a top mask 24, a core layer 28, and a bottom mask 24. Traces 23 are located on the top and bottom surfaces of the substrate 20. The top portion of FIG. 31 shows a magnetic component 100 including two block coils 10 mounted to the single-layer substrate 20 and including a magnetic core 30. The traces 23 are on the top surface of the single-layer substrate 50. The single-layer substrate 20 allows for a smaller magnetic component 100 or electronic module 200. As an example, one of the block coils 10 can include primary terminals 11 and the other block coils 10 can include secondary terminals 11 so that primary traces 23 connected to the primary terminals 11 and the secondary traces 23 connected to the secondary terminals can be located on the same surface of the substrate 10.

As shown in FIG. 10, portions of the secondary traces 23 and the primary traces 23 can overlap vertically, which can improve coupling between the primary and the secondary windings. The larger the overlap between the primary and the secondary windings, the larger the coupling between the primary and the secondary windings. The resistance can be lowered if primary traces 23 or if the secondary traces 23 are located on adjacent layers. That is, the resistance can be lowered in the primary winding if primary traces 23 on different layers are only separated by a single layer, and the resistance can be lowered in the secondary winding if secondary traces 23 on different layers are only separated by a single layer.

Figure 11:
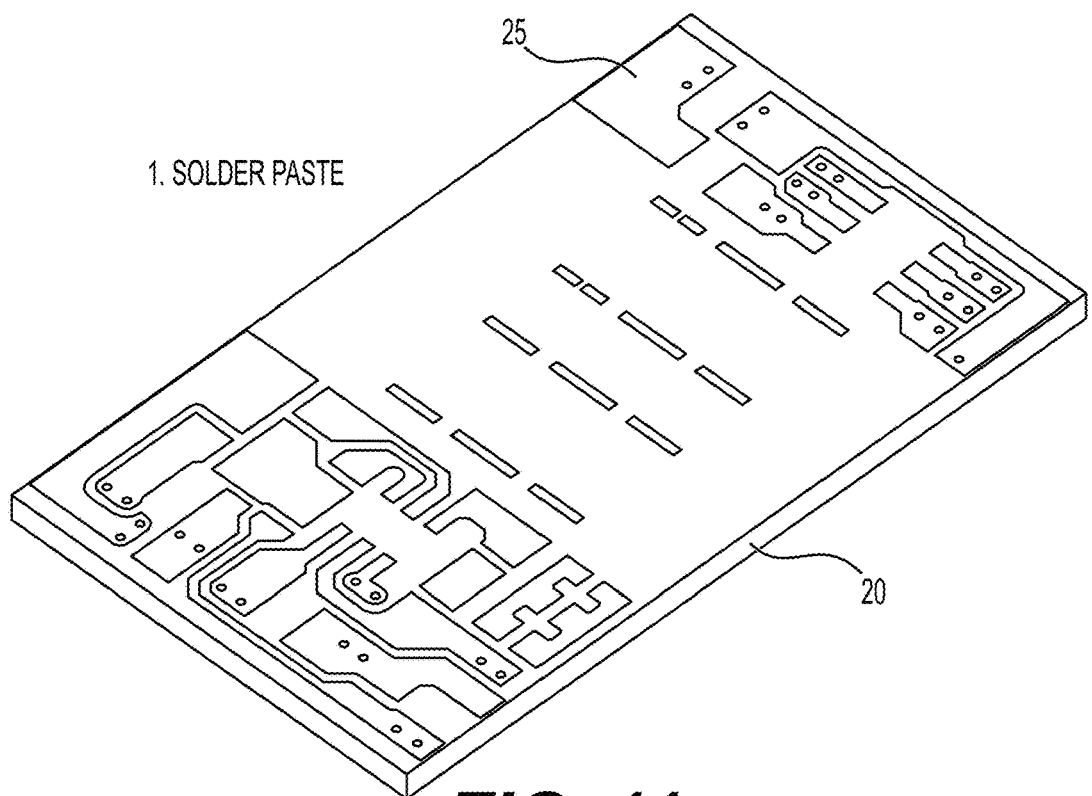
FIGS. 11-15 are perspective views showing a method of manufacturing the electronic module of FIG. 3.
Figure 12:
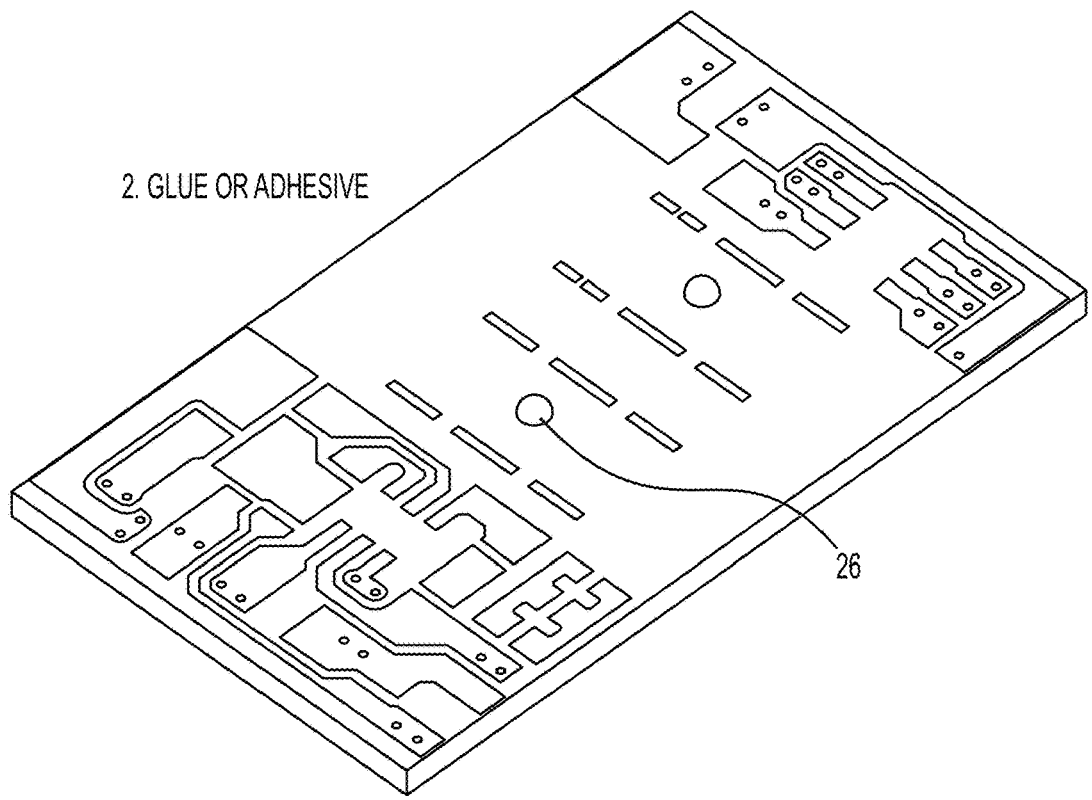
Figure 13:
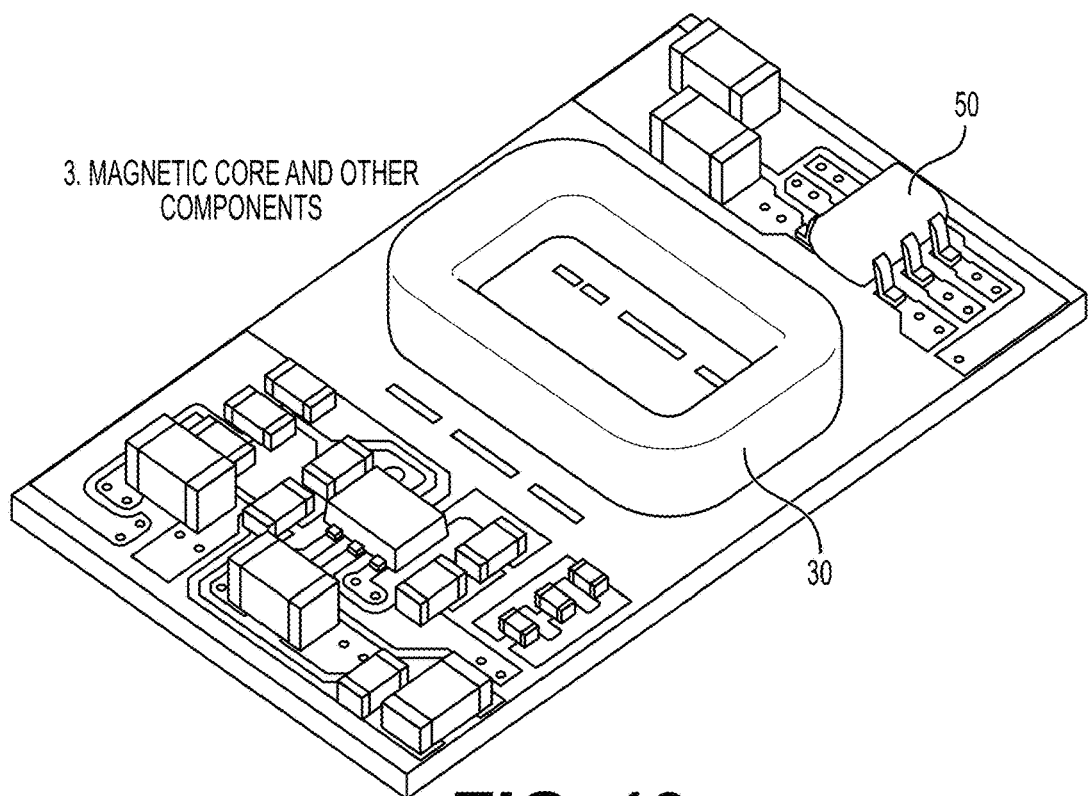
Figure 14:
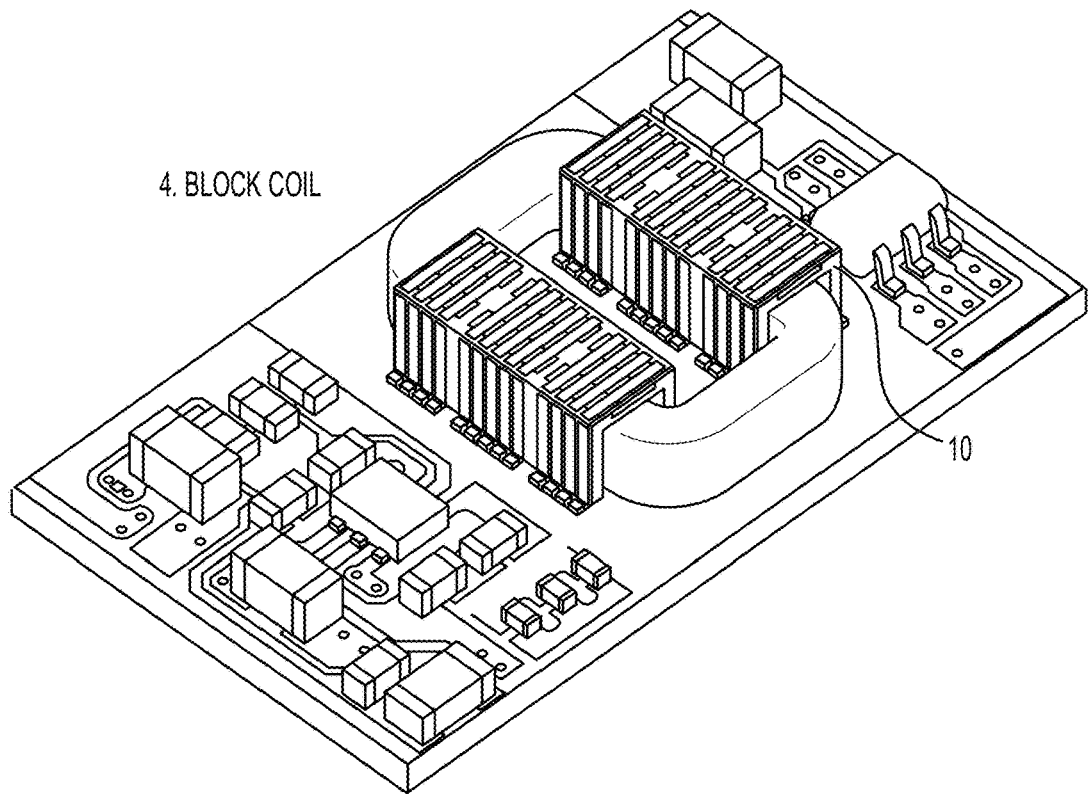
Figure 15:
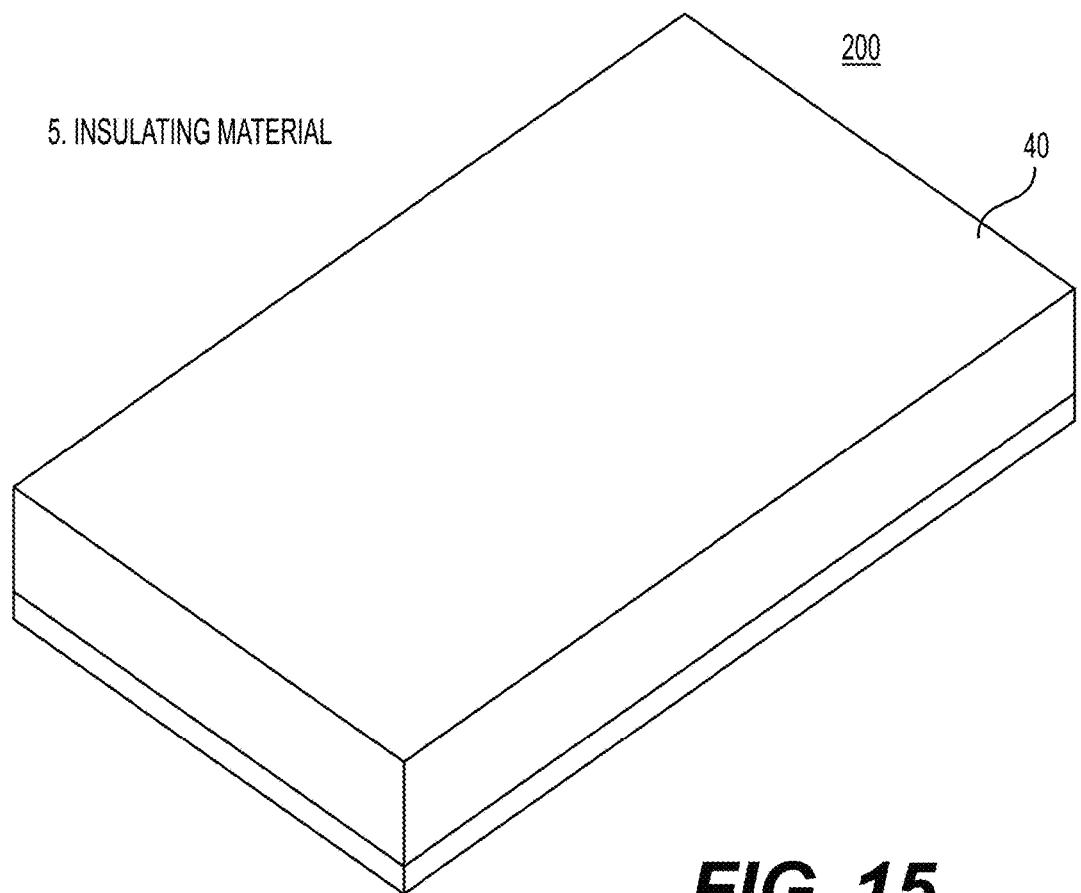

FIGS. 11-15 show a method of making an electronic module 200 with block coils 10 mounted to a substrate 20. FIG. 11 shows providing a substrate 20 and them applying solder paste 25. The substrate 20 can be one of the substrates 20 discussed above and can be multi-layer or single-layer substrate. FIG. 12 shows glue or adhesive 26 being dispensed on the substrate 20. The glue or adhesive 26 can be dispensed as part of a surface mount technology (SMT) process or separate from an SMT process. FIG. 13 shows the placement of the magnetic core 30 and the electronic component(s) 50. FIG. 14 shows the placement of two block coils 10 that extend over or bridge the magnetic core 30. FIG. 15 shows insulating material 40 covering the substrate 20, the electronic component(s) 50, the magnetic core 30, and the block coils 10. FIG. 15 shows that the insulating material 40 covers the entire substrate 20, but the insulating material 40 can cover only a portion of the substrate 40 and/or cover only one or some of the electronic component(s) 50, the magnetic core 30, and the block coils 10. Typically, a mother substrate can be used in which an array of electronic modules 200 are included in the mother substrate. The mother substrate is then diced or singulated to form individual electronic modules 200. Alternative, individual electronic module 200 can be manufactured without using a mother substrate.

FIGS. 19-23 show a magnetic component 100 similar to the magnetic component 100 of FIG. 1. For brevity, descriptions of similar components are not repeated. The magnetic component 100 can include the block coils 10 and the magnetic core 30 of the magnetic component 100 of FIG. 1.

Figure 19:
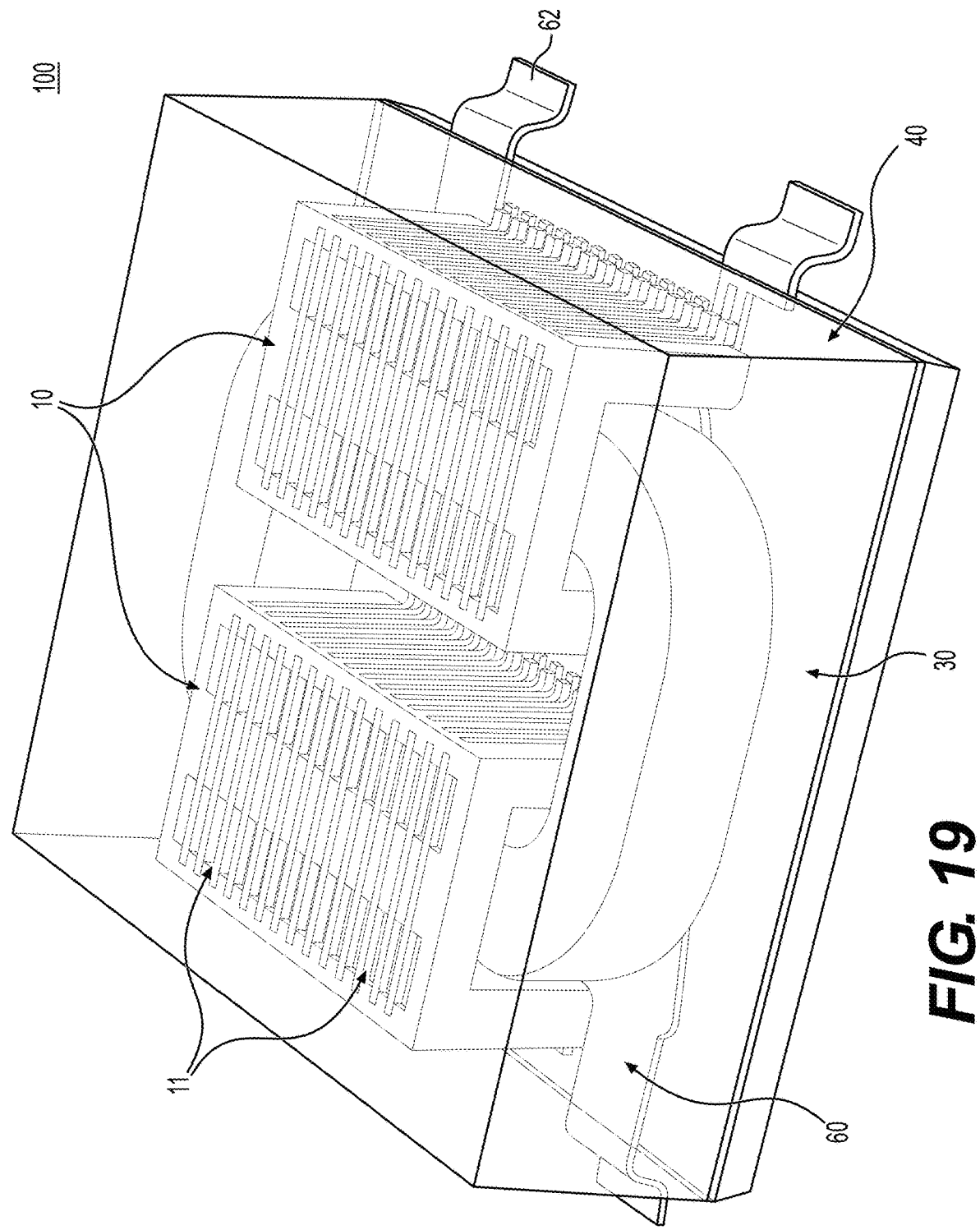
FIG. 19 is a top perspective view of block coils mounted to lead frame of a magnetic component.
Figure 20:
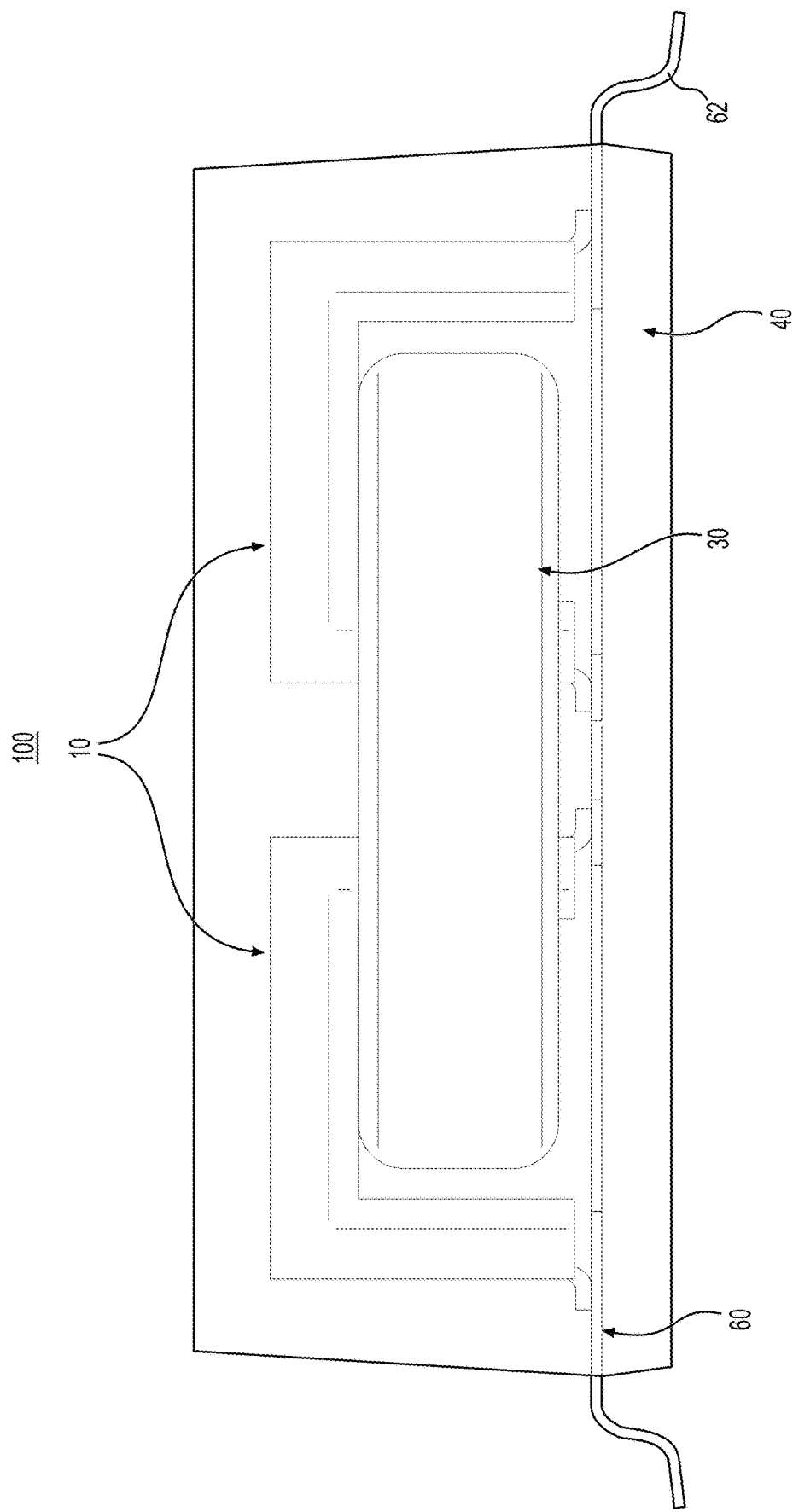
FIG. 20 is a side sectional view of the block coils mounted to the lead frame of the magnetic component of FIG. 19.
Figure 21:
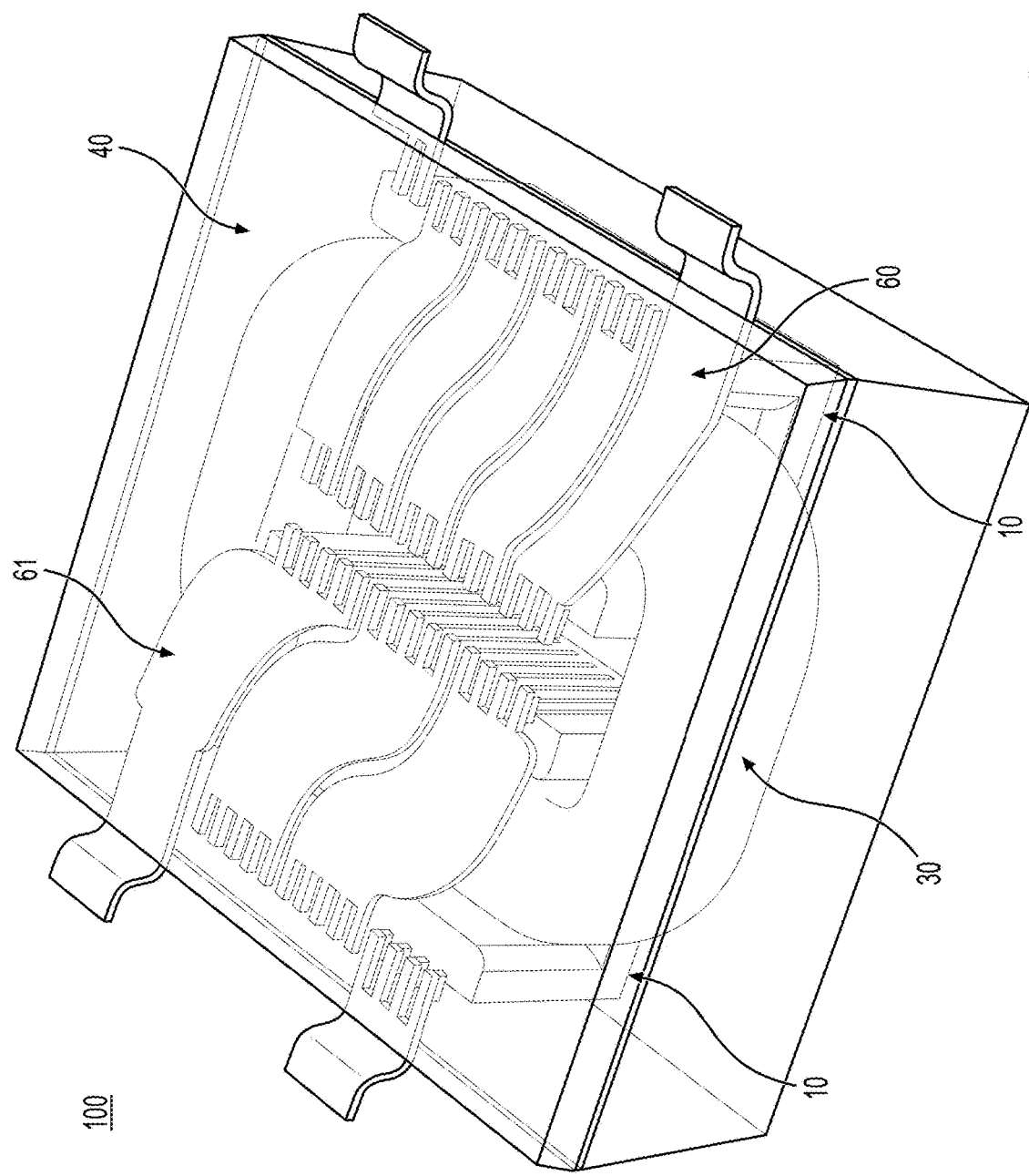
FIG. 21 is a bottom perspective view of the block coils mounted to the lead frame of the magnetic component of FIG. 19.
Figure 22:
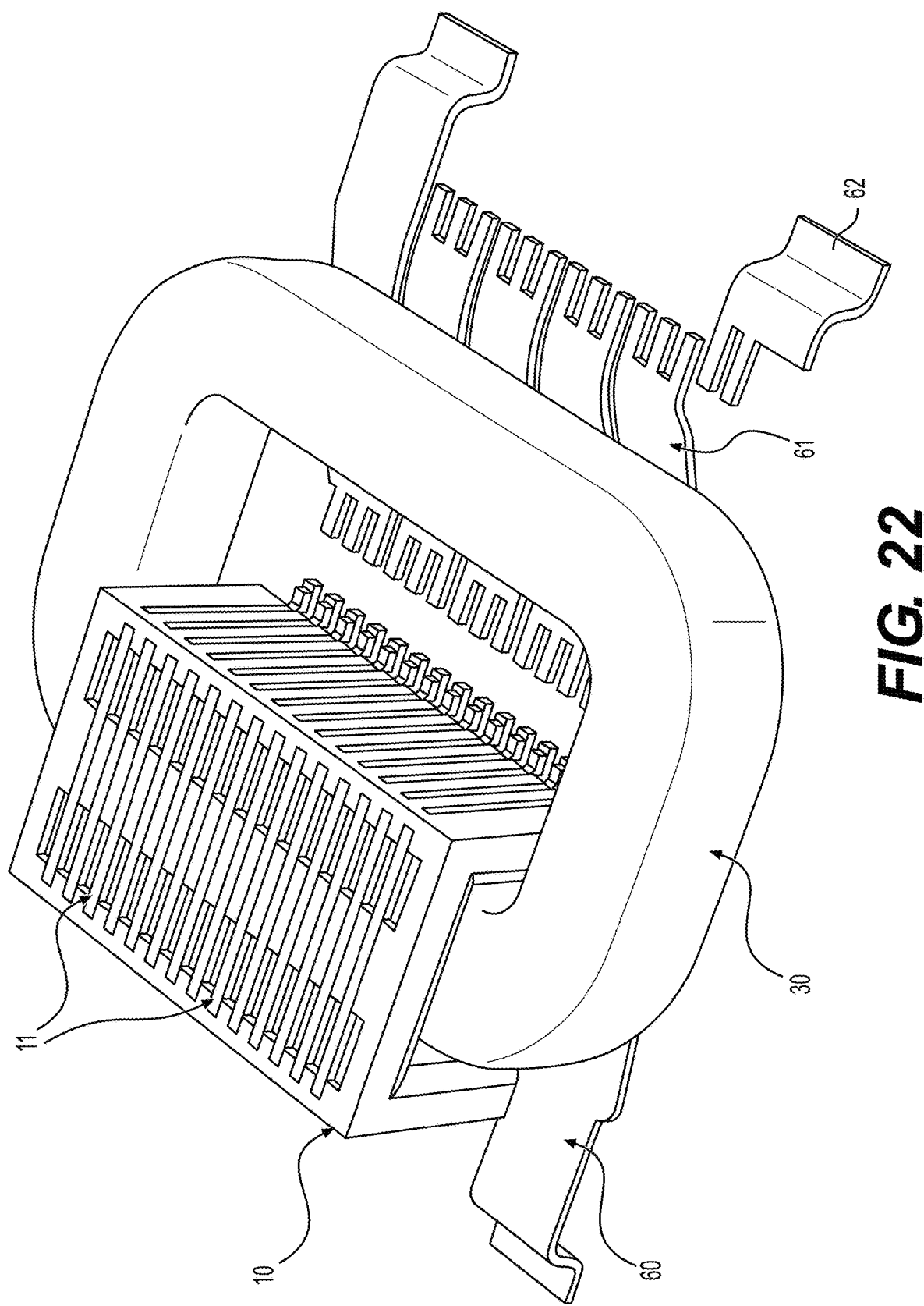
FIG. 22 is a top perspective view of a partially assembled magnetic component of FIG. 20.
Figure 23:
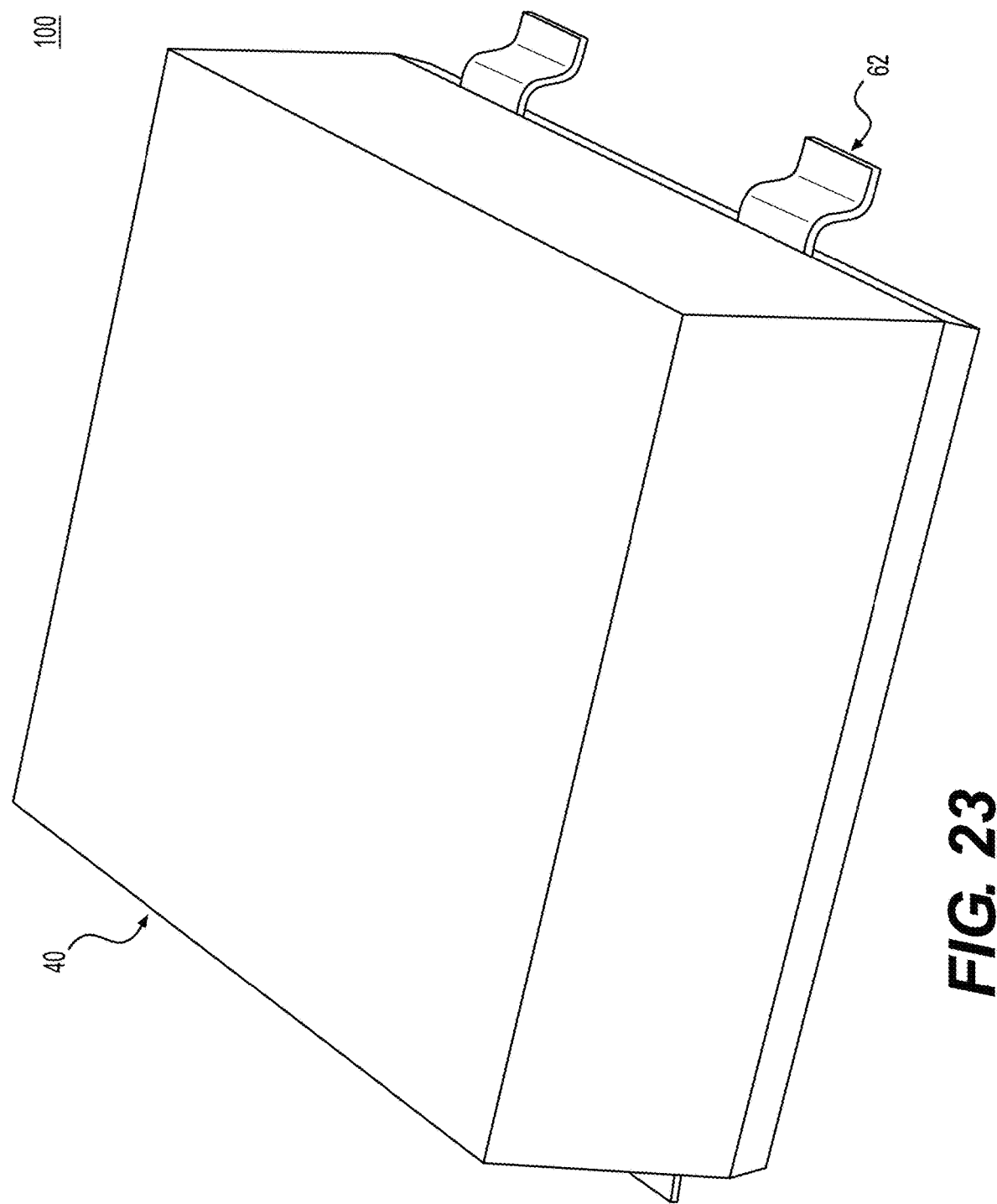
FIG. 23 is a top perspective view of the magnetic component of FIG. 20 with insulating material covering the block coils.

The magnetic component 100 of FIGS. 19-23 is different from the magnetic component 100 of FIG. 1 in that the block coils 10 of the magnetic component 100 of FIGS. 19-23 are connected to a lead frame 60 instead of a substrate 20. The magnetic component 100 of FIGS. 19-23 includes an insulating material 40, which is similar to the insulating material 40 applied to the electronic module 200 of FIG. 4. In FIGS. 19-21, the insulating material 40 is shown as transparent, but in FIG. 23, the insulating material 40 is shown as not being transparent. For clarity, FIG. 22 does not show the insulating material 40 and one of the block coils 10.

Although not shown, additional electronic components can be included to form an electronic module 200 so that the magnetic component 100 can be part of, for example, a DC-DC converter.

The lead frame 60 can include mounting terminals 62 and conductive patterns 61. The mounting terminals 62 can be used to connect the lead frame 60, and the magnetic component 100 or electronic module 200, to a host substrate (not shown). The conductive patterns 61 are similar to the traces 23 included on or in the substrate 20, and, as similarly described above, the conductive patterns 61 can connect one or more terminals 11 to define a single turn of winding. The conductive patterns 61 can determine which winding a terminal 11 is connected to. For example, the conductive patterns 61 can be connected to the terminals 11 such that one block coil 10 includes two turns of a primary winding and that the other block coil includes four turns of a secondary winding. The terminals 11 in the block coils 10 in the magnetic component 100 of FIGS. 19-23 can be separated into different terminal groups as described above with respect to the block coils 10 in the magnetic component 100 of FIG. 1.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. An electronic module comprising,
   a substrate or a lead frame including primary conductive patterns and secondary conductive patterns;
   a magnetic core located on or above of the substrate or the lead frame;
   a block coil including:
      a resin body that is located on or above the substrate or the lead frame and that extends over the magnetic core;
      first terminals that define a first terminal group and that are on or embedded in the resin body; and
      second terminals that define a second terminal group and that on or are embedded in the resin body;
   an IC located on the substrate or the lead frame; and
   a capacitor located on the substrate or the lead frame; wherein
   two first terminals of the first terminal group are connected to corresponding primary conductive patterns;
   two second terminals of the second terminal group are connected corresponding secondary conductive patterns; and
   a first primary conductive pattern is closer to a second primary conductive pattern than any of the secondary conductive patterns.

2. The electronic module according to claim 1, wherein each first terminal in the first terminal group is connected to a corresponding primary conductive pattern; and
   each second terminal in the second terminal group is connected to a corresponding secondary conductive pattern.

3. The electronic module according to claim 1, wherein the first terminal group is located next to and spaced away from the second terminal group.

4. The electronic module according to claim 1, wherein the substrate or the lead frame includes first and second layers.

5. The electronic module according to claim 4, wherein the primary conductive patterns are in the first layer;
   the secondary conductive patterns are in the second layer; and
   from a side view of the substrate, portions of the primary conductive patterns overlap vertically corresponding portions of the secondary conductive patterns.

6. The electronic module according to claim 5, further comprising:
   additional primary conductive patterns in a third layer of the substrate; and
   additional secondary conductive patterns in a fourth layer of the substrate; wherein
   from the side view of the substrate, portions of the additional primary conductive patterns overlap vertically corresponding portions of the additional secondary conductive pattern.

7. The electronic module according to claim 1, further comprising an insulating material covering the substrate or the lead frame, the magnetic core, and the block coil.

8. The electronic module according to claim 1, wherein the electronic module includes the substrate; and
   the substrate includes a via hole.

9. The electronic module according to claim 1, wherein the magnetic core is located on or above a first surface of the substrate or the lead frame; and
   the capacitor is located on a second surface of the substrate or the lead frame opposite to the first surface.

10. The electronic module according to claim 1, further comprising a coating covering the magnetic core.

11. An electronic module comprising:
    a substrate or a lead frame including primary conductive patterns and secondary conductive patterns;
    a magnetic core located on or above of the substrate or the lead frame;
    first and second block coils, each of the first and the second block coils including:
       a resin body that is located on or above the substrate or the lead frame and that extends over the magnetic core;
       first terminals that define a first terminal group and that are on or embedded in the resin body; and
       second terminals that define a second terminal group and that are on or embedded in the resin body; and
    an IC located on the substrate or the lead frame; and
    a capacitor located on the substrate or the lead frame; wherein
    two first terminals of the first terminal group are connected to corresponding primary conductive patterns;

two second terminals of the second terminal group are connected corresponding secondary conductive patterns; and a first primary conductive pattern is closer to a second primary conductive pattern than any of the secondary conductive patterns.

12. The electronic module according to claim 11, wherein each first terminal in the first terminal group is connected to a corresponding primary conductive pattern; and each second terminal in the second terminal group is connected to a corresponding secondary conductive pattern.

13. The electronic module according to claim 11, wherein the first terminal group is located next to and spaced away from the second terminal group.

14. The electronic module according to claim 11, wherein the substrate or the lead frame includes first and second layers.

15. The electronic module according to claim 14, wherein the primary conductive patterns are in the first layer;

the secondary conductive patterns are in the second layer; and from a side view of the substrate, portions of the primary conductive patterns overlap vertically corresponding portions of the secondary conductive patterns.

16. The electronic module according to claim 15, further comprising:

additional primary conductive patterns in a third layer of the substrate; and additional secondary conductive patterns in a fourth layer of the substrate; wherein from the side view of the substrate, portions of the additional primary conductive patterns overlap vertically corresponding portions of the additional secondary conductive pattern.

17. The electronic module according to claim 11, further comprising an insulating material covering the substrate or the lead frame, the magnetic core, and the block coil.

18. The electronic module according to claim 11, wherein the electronic module includes the substrate; and the substrate includes a via hole.

19. The electronic module according to claim 11, wherein the magnetic core is located on or above a first surface of the substrate or the lead frame; and the capacitor is located on a second surface of the substrate or the lead frame opposite to the first surface.

20. The electronic module according to claim 11, further comprising a coating covering the magnetic core.

* * * * *